US011745473B2

(12) United States Patent
Hody LeCaër et al.

(10) Patent No.: US 11,745,473 B2
(45) Date of Patent: *Sep. 5, 2023

(54) LAMINATED GLAZING WITH COLOURED REFLECTION AND HIGH SOLAR TRANSMITTANCE, AND SOLAR ENERGY SYSTEMS EMPLOYING THE SAME

(71) Applicant: Kromatix SA, Romont (CH)

(72) Inventors: Virginie Hody LeCaër, Bussigny-pres-Lausanne (CH); Andreas Schüler, Lausanne (CH)

(73) Assignee: KROMATIX SA

( * ) Notice: Subject to any disclaimer, the term of this patent is extended or adjusted under 35 U.S.C. 154(b) by 267 days.

This patent is subject to a terminal disclaimer.

(21) Appl. No.: 17/174,925

(22) Filed: Feb. 12, 2021

(65) Prior Publication Data

US 2021/0206146 A1  Jul. 8, 2021

Related U.S. Application Data

(63) Continuation-in-part of application No. 16/044,680, filed on Jul. 25, 2018, now Pat. No. 10,953,635,
(Continued)

(30) Foreign Application Priority Data

Sep. 20, 2012 (WO) ................. PCT/IB2012/055000

(51) Int. Cl.
*B32B 17/10* (2006.01)
*F24S 80/52* (2018.01)
(Continued)

(52) U.S. Cl.
CPC .......... *B32B 17/10201* (2013.01); *B32B 7/02* (2013.01); *B32B 17/06* (2013.01);
(Continued)

(58) Field of Classification Search
None
See application file for complete search history.

(56) References Cited

U.S. PATENT DOCUMENTS

| 3,573,156 A | 3/1971 | Reilly |
| 4,055,458 A | 10/1977 | Niederprum |
| (Continued) | | |

FOREIGN PATENT DOCUMENTS

| EP | 0964288 | 12/1999 |
| JP | S62213283 | 9/1987 |
| WO | 2004079278 | 9/2004 |

OTHER PUBLICATIONS

International Search Report for International (PCT) Patent Application No. PCT/IB13/58115, dated Mar. 17, 2014, 4 pages.
(Continued)

*Primary Examiner* — Prashant J Khatri
(74) *Attorney, Agent, or Firm* — Quarles & Brady LLP; Yakov S. Sidorin

(57) ABSTRACT

Laminated (and, in some cases, additionally etched) glazing units for cooperation with solar-energy systems during architectural integration thereof include an optically-transparent substrate in contact with an incident medium, on one side, and with a non-quarter-wave thin-film-stack based interference filter on another side, followed by an exit medium. Embodiments are practically applicable to conceal physical structures disposed behind them and characterized by IR-light transmittance that is enhanced (as compared with conventional glazing units based on quarter-wave thin-film-stacks and similarly utilized) to improve efficiency of a solar-energy system carrying at least a portion of such glazing unit on its front surface. Colour of reflected light perceived as a function of angle is sufficiently stabilized for
(Continued)

practical applications. In specific cases, a solar-energy system is integrated inside or with such a glazing unit.

20 Claims, 21 Drawing Sheets

Related U.S. Application Data which is a continuation of application No. 14/429,293, filed as application No. PCT/IB2013/058115 on Aug. 29, 2013, now abandoned.

(51) Int. Cl.
| | |
|---|---|
| G02B 5/28 | (2006.01) |
| B32B 17/06 | (2006.01) |
| H02S 20/23 | (2014.01) |
| H02S 20/26 | (2014.01) |
| B32B 7/02 | (2019.01) |
| H01L 31/048 | (2014.01) |

(52) U.S. Cl.
CPC ........ *B32B 17/10* (2013.01); *B32B 17/10036* (2013.01); *B32B 17/10146* (2013.01); *B32B 17/10743* (2013.01); *B32B 17/10761* (2013.01); *B32B 17/10788* (2013.01); *F24S 80/52* (2018.05); *G02B 5/281* (2013.01); *G02B 5/286* (2013.01); *H01L 31/0488* (2013.01); *H02S 20/23* (2014.12); *H02S 20/26* (2014.12); *B32B 2307/418* (2013.01); *B32B 2367/00* (2013.01); *B32B 2457/00* (2013.01); *Y02B 10/10* (2013.01); *Y02E 10/40* (2013.01); *Y10T 428/2495* (2015.01); *Y10T 428/24355* (2015.01); *Y10T 428/24942* (2015.01); *Y10T 428/24967* (2015.01)

(56) References Cited

U.S. PATENT DOCUMENTS

| | | | |
|---|---|---|---|
| 4,582,624 | A | 4/1986 | Enjo |
| 4,896,928 | A | 1/1990 | Perilloux |
| 4,944,986 | A | 7/1990 | Zuel |
| 5,091,053 | A | 2/1992 | Blonder |
| 5,120,605 | A | 6/1992 | Zuel |
| 5,281,350 | A | 1/1994 | Gimm |
| 5,318,830 | A | 6/1994 | Takatmatsu |
| 6,391,400 | B1 | 5/2002 | Russell |
| 7,276,181 | B2 | 10/2007 | Miwa |
| 2008/0316594 | A1 | 12/2008 | Hashiguchi |
| 2009/0101192 | A1 | 4/2009 | Kothari |
| 2011/0096555 | A1 | 4/2011 | Pires |
| 2011/0232213 | A1 | 9/2011 | Jousse |
| 2012/0052244 | A1 | 3/2012 | Schoenberger |
| 2015/0249424 | A1 | 9/2015 | Hody Le Caer et al. |
| 2017/0123122 | A1 | 5/2017 | Ballif |

OTHER PUBLICATIONS

Written Opinion for International (PCT) Patent Application No. PCT/IB13/58115, dated Mar. 17, 2014, 7 pages.

International Preliminary Report on Patentability for International (PCT) Patent Application No. PCT/IB13/58115, dated Mar. 24, 2015, 7 pages.

Official Action for Australian Patent Application No. 2013319925, dated Mar. 4, 2016, 3 pages.

Official Action for Australian Patent Application No. 2013319925, dated Nov. 12, 2016, 3 pages.

Official Action (with English Translation) for Chinese Patent Application No. 2013800489806, dated Jan. 6, 2016, 10 pages.

Macleod, "Thin Film Optical Filters," Institute of Physics Publishing, 1969, abstract only, 2 pages.

"CIE Recommendations on Colorimetry," 1986, CIE Publication 15.2, 2nd ed., 1 page.

CIE Technical Report, Colorimetry, 3rd ed. Publication 15:2004, 82 pages.

Probst et al., "Towards an improved architectural quality of building integrated solar thermal systems (BIST)," Solar Energy, 2007, vol. 81(9), pp. 1104-1116, abstract only, 2 pages.

Boudaden et al., "Towards coloured glazed thermal solar collectors," Solar Energy Materials & Solar Cells, 2004, vol. 84(1-4), pp. 225-239, abstract only, 3 pages.

Schuler et al., "On the feasibility of colored glazed thermal solar collectors based on thin film interference filters," Solar Energy Materials and Solar Cells, 2004, vol. 84(1-4), pp. 241-254, abstract only, 3 pages.

Schuler et al., "Potential of quarterwave interference stacks for colored thermal solar collectors," Solar Energy, 2005, vol. 79(2), pp. 122-130.

Schuler et al., "Thin film multilayer design types for colored glazed thermal solar collectors," Solar Energy Materials & Solar Cells, 2005, vol. 89(2-3), pp. 219-231, abstract only, 3 pages.

Official Action for U.S. Appl. No. 14/429,293, dated Jun. 15, 2017, 18 pages.

Official Action for U.S. Appl. No. 14/429,293, dated Jan. 29, 2018 15 pages.

Dobrowolski, J.A.(eds. Bass et al.). Chapter 42: Optical Properties of Films and Coatings, Handbook of Optics, vol. 1: Fundamentals, Techniques, and Design, (1995); pp. 42.3-42.130.

Thelen, A. "Multilayer Filters with Wide Transmission Bands", Journal of the Optical Society of America, vol. 53, No. 11, (1963); pp. 1266-1270.

Bezuidenhout et al. "The optical properties of evaporated Y2O3 films", Thin Sold Films, vol. 139, Issue 2, (1986); Abstract.

Ramana et al. "Enhanced optical constants of nanocrystalline yttrium oxide thin films", Applied Physics Letters, 98, (2011); pp. 031905. 1-031905.3.

Schulz et al. "Antireflection of transparent polymers by advanced plasma etching procedures", Optics Express, vol. 15, No. 20, ( 2011); pp. 13108-13113.

Hody-Le Caer, V., et al. "Optical and morphological characterisation of low refractive index materials for coatings on solar collector glazing." Renewable energy 53 (2013): 27-34.

Schüler, A., et al. "Sol-gel deposition and optical characterization of multilayered SiO2/Ti1-xSix02 coatings on solar collector glasses." Solar energy materials and solar cells 90.17 (2006): 2894-2907.

Edmund Optics. An Introduction to Optical Coatings. Available online at https://www.edmundoptics.com/knowledge-center/application-notes/lasers/an-introduction-to-optical-coatings/. Version accessed on Sep. 26, 2020.

LAMINATED GLAZING WITH COLOURED REFLECTION AND HIGH SOLAR TRANSMITTANCE, AND SOLAR ENERGY SYSTEMS EMPLOYING THE SAME

CROSS-REFERENCE TO RELATED APPLICATIONS

This patent application is a continuation-in-part from the U.S. patent application Ser. No. 16/044,680, filed on Jul. 25, 2018 and published as US 2019/0081588, which is a continuation of U.S. patent application Ser. No. 14/429,293, filed on Mar. 18, 2015 and now abandoned, which in turn is a national phase of the international patent application PCT/IB2013/058115 filed on Aug. 29, 2013, which in turn claims priority from the patent application PCT/IB2012/055000 filed on Sep. 20, 2012. The disclosure of each of the above-identified patent applications is incorporated herein by reference.

TECHNICAL FIELD

The present application relates to articles of manufacture that include laminated glazing systems and, in particular, to laminated glazing systems or units configured for architectural integration of or in the solar energy systems (such as to form, for example, solar-energy collecting glass facades).

RELATED ART

The acceptance and utilization of solar energy systems as integrated elements of a building's structure and, in particular, façade—is mainly limited by their unpleasant visual aspect. Solar energy systems are often considered to be technical components that ought to be hidden from view (and, at least in part for that reason—are often limited in use to those lending themselves to roof-top applications, where such systems are less visible and have lower impact on the architectural design of a given building). The development of more visually-appealing and better-looking solar systems could open up new perspectives for the architectural integration of solar energy systems, for example as solar active glass facades.

One approach to configuring such more visually-appealing solar systems is to apply a coloured interferential thin film to the inner side of the glazing of the solar system. The coating then reflects incident light within a pre-determined spectral bandwidth (defining a colour of the reflected light) thereby at least partially hiding the technical structure of the solar device from view, while transmitting light with the complementary spectrum. Coloured glass panes that utilize such dielectric thin film deposition have been demonstrated to be of special interest for solar thermal collectors, and were discussed in the international patent application publication WO 2004/079278 by A. Schuler. The invention disclosed in that PCT application had, however, several practical shortcomings dealing with:

(a) Security Concerns. Here, the implementation of the proposed idea considered the use of non-tempered, non-laminated glazing that did not fulfil the security requirements for facade installation. Therefore, the thin-film structure designs devised for single glazing (exit medium: air, $n_{exit}=1$) are not suitable for laminated version of glazing (where exit medium is a polymer; $1.45 \leq n_{exit} \leq 1.6$ at 550 nm).

(b) Colour Stability Concerns. In the context of WO 2004/079278, the colour of light reflected off from the panes was defined by the use of quarter-wave interference thin-film stacks exhibiting spectrally-narrow reflection peaks. By limiting the number of individual layers in such stacks and appropriately choosing the refractive indices of the involved materials, the inventors demonstrated reasonable-level irradiances corresponding to reflection peak(s) thereby ensuring excellent solar transmittance at the coating. However, as the narrow reflection peak shifts to smaller wavelength with increase of the angle of incident (and therefore angle of reflection), the light observed by the viewer in reflection from such a pane starts exhibiting colours (except blue) that depend on the angle of vision/observation/reflection. To this end, Example 1 below presents a design of the thin-film coating with the reflection peak in the green portion of the visible optical spectrum, which shifts towards blue portion of the spectrum for increasing angles of observation (see also FIG. 1, FIG. 2, and Table 1).

(c) Considerations of Production at the Industrial Scale. As a person of ordinary skill in the art will readily appreciate, relatively thick (>100 nm) $SiO_2$ layers were required to implement the invention discussed in WO 2004/079278, the formation of which in the fabrication setting naturally limits the production speed of coloured glasses on the industrial scale.

The disclosure of WO 2004/079278 also referred to the possibility of applying a surface treatment (such as, for example, hot patterning, acid etching, sand or stone projections . . . ) on the outer side of the collector glazing to in order to transmit light through the glazing in a spatially-diffusing fashion. This treatment often has the effect of reinforcing the masking effect of the solar device technical parts, preventing glare effects and producing mat surfaces that are in high demand in today's architecture. Amongst available diffusive surface treatments, acid etching is very likely the most suitable and most widely used at the industrial level. Historically, acidic etching treatments of glasses are performed by using fluoridric-acid-based-solutions. Fluoridric (or, hydrofluoric) acid is a strong chemical agent responsible of various problems in terms of safety, health of workers and environmental pollution. For this reason, the use of buffered solutions (in which a part of the fluoridric acid is replaced by fluoride salts such as ammonium bifluoride) or solutions based on fluoride salts, less aggressive and more environmentally friendly, are becoming more common.

There remains an unmet need in devising laminated glazing solutions for solar energy systems that address the above-mentioned and other shortcomings of the products of related art.

BRIEF DESCRIPTION OF THE DRAWINGS

The invention will be more fully understood by referring to the following Detailed Description in conjunction with the generally not-to-scale Drawings, of which:

FIG. 7B presents a similar plot characterizing a design of a green coating of FIG. 6 with the three reflection peaks in the visible part of the solar spectrum.

FIG. 27A: ABF/IPA/$H_2O$=30/10/60; 15 min etch time. FIG. 27B: ABF/sucrose/$H_2O$=18/18/64; 15 min etch time.

FIG. 28A: an example of roof installation with glazing overlap. FIG. 28B: an example of installation for residential ventilated façade. FIG. 28C: an example of adaptation of the mounting structure to large buildings with glass facades.

Figure 1:
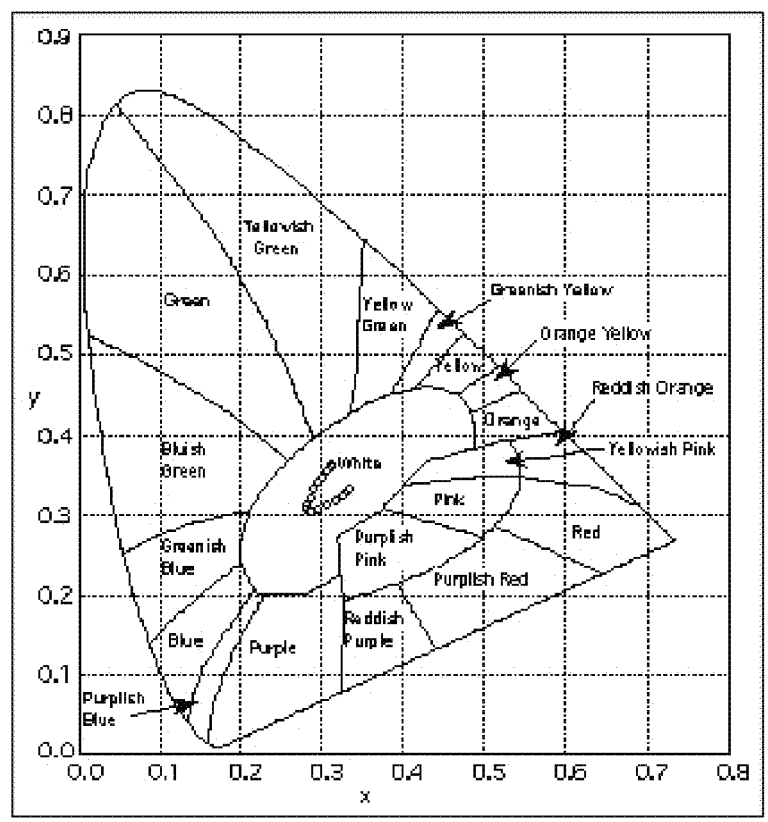
FIG. 1 illustrates angular dependency of 1931 CIE (x, y) colour coordinates (under CIE-D65 illuminant) of the thin-film stack embodiment described in Example 1.
Figure 2:
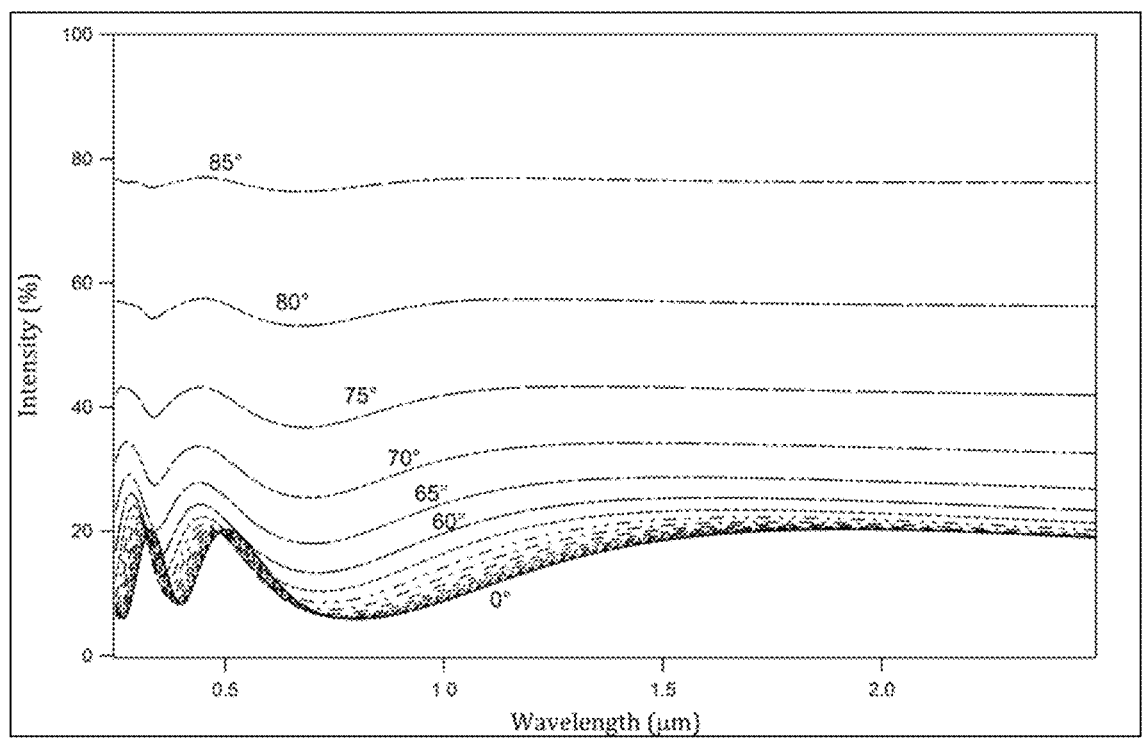
FIG. 2 is a plot containing reflectance curves of the coating of Example 1 for various angles of incidence (and reflection) of light, ranging from 0° to 85°.

Generally, the sizes and relative scales of elements in Drawings may be set to be different from actual ones to appropriately facilitate simplicity, clarity, and understanding of the Drawings. For the same reason, not all elements present on one Drawing may necessarily be shown in another.

SUMMARY

Embodiments of the invention provide various laminated glazing units for architectural integration of solar energy systems. Generally, and according to implementations of an idea of the invention, a laminated glazing unit includes a layered glazing structure that, in turn, contains a substrate having a substrate refractive index $n_{sub}$ a value of which at a wavelength of 550 nm is between 1.45 and 1.6, a multi-layered interference filter disposed on a first surface of the substrate and including a non-quarter-wave thin-film stack defined at the wavelength of 550 nm. Thicknesses of any two high-index material layers sandwiching an immediately-adjacent low-index material layer therebetween are different from one another and thicknesses of any two low-index material layers sandwiching an immediately-adjacent high-index material layer therebetween are different from one another, while each of the high-index layers has a refractive index from 1.8 to 2.5 and each of the low refractive index layers has a refractive index from 1.25 to 2.2. In an embodiment, a laminating polymer layer is disposed on the multi-layered interference filter; such laminating polymer layer has a polymer refractive index $n_{pol}$ a value of which at the wavelength of 550 nm between 1.45 and 1.6. In any embodiment, the layered glazing structure is characterized—when the substrate is in contact with an incident medium having a refractive index of $n_{inc}=1$ by a first reflectance value for IR light at every wavelength between 1 micron and 2.5 micron of between 65% and 29% for at least angles of reflection of zero degrees, 65 degrees, 70 degrees, 75 degrees, 80 degrees, and 85 degrees. Generally, such multi-layered interference filter includes a thin-film stack of up to 9 layers that have corresponding physical thicknesses of up to 400 nm, wherein materials of said layers have corresponding extinction coefficients k not exceeding 0.2 at every wavelength between 450 nm and 2,500 nm.

In substantially any implementation, a second surface of the substrate may be structured to contain a surface microstructure or a surface nano-structure configured as a light diffuser for light at wavelengths in the visible portion the optical spectrum. Substantially any embodiment may be specifically configured to satisfy at least one of the following conditions: (a) to have a variation of a dominant wavelength $\lambda_{MD}$ of a dominant color, characterizing light in the visible portion of the optical spectrum that is reflected by the layered glazing structure at an angle $\theta_r$, of less than 5 nm for every $\theta_r<60°$; and (b) to have the glazing unit additionally include a solar thermal collector or a solar photovoltaic (PV) panel disposed to be separated from the multi-layered interference filter by the laminating polymer layer. (In the latter case, the solar thermal collector and the laminating polymer layer can be disposed in direct contact with one another and/or an active element of the solar PV panel can be fully integrated in the layered glazing structure.) At least in one implementation, the substrate of the glazing structure may include solar roll glass, an extra-white float glass with iron content of less than 120 ppm, or a polymeric material characterized by a total hemispherical solar transmittance higher than 90%. In at least one implementation, the laminating polymer layer may include an elastomer cross-linking polymer, a thermoplastic product, or an ionoplastic polymer, in which case the total hemispherical solar transmittance achieved for such glazing unit is higher than 92% when a thickness of the laminating polymer layer is between 0.4 mm and 0.5 mm.

Embodiments of the invention also provide a laminated glazing unit as discussed above but with the high-index layers having a refractive index from 1.8 to 2.5 and the low refractive index layers having a refractive index from 1.25 to 2.2 while the layered glazing structure of the unit possesses a first reflectance value for IR light (at every wavelength between 1 micron and 2.5 micron) of between 65% and 14% for at least angles of reflection of zero degrees, 65 degrees, 70 degrees, 75 degrees, 80 degrees, and 85 degrees when the substrate of the glazing structure is in contact with an incident medium having a refractive index of $n_{inc}=1$. IN a specific implementation of such laminated glazing unit, a variation of a dominant wavelength $\lambda_{MD}$ of a dominant colour (characterizing light in the visible portion of the optical spectrum that has been reflected by the layered glazing structure at an angle $\theta_r$) is smaller than at least one of 3 nm for every $\theta_r<60°$ and 1 nm for every $\theta_r<75°$.

Embodiments of the invention further provide a laminated glazing unit as discussed above. In which each of the high-index layers has a refractive index from 1.8 to 2.5 and each of the low refractive index layers each have a refractive index from 1.25 to 2.2, while the layered glazing structure (when the substrate is in contact with an incident medium having a refractive index of $n_{inc}=1$) is characterized by a first reflectance value for IR light (at every wavelength between 1 micron and 2.5 micron) of between 18% and 5% for at least angles of reflection of zero degrees, 15 degrees, 30 degrees, 45 degrees, 60 degrees, 70 degrees, and 75 degrees.

DETAILED DESCRIPTION

Embodiments of the invention are directed to design and use, in architectural integration, of a specific article of manufacture—a laminated glazing unit—configured to transmit, towards a solar energy system, a portion of sunlight that can be transformed by such energy system into energy (an example the photo-voltaic conversion of sun-light into electricity) while, at the same time, reflecting light in the visible portion of the solar spectrum to an outside viewer of the solar energy system such as to mask or hide the presence of the solar energy system in reflected light. As a result of such spectral differentiation between the sunlight that is transmitted and reflected by a given embodiment of the invention, the viewer is caused to observe a visually-pleasing picture (a beautified version of the solar energy system, so to speak) instead of the solar system as it is. Examples of implementation of the idea of the invention include, without limitation, panes containing a judiciously-designed and laminated between the substrate and the polymer layer optical interference filter.

The particulars of the claimed design(s) are not trivial as they are specifically aimed at addressing the issues persisting in conventional quarter-wave-stack-based solutions of related art such as spectrally-narrow reflection peaks formed by conventional interference filters based on quarter-wave stacks of optical thin-films. The very nature and optics of the quarter-wave stacks inevitably result in a spectral shift of these reflectance peaks as a function of viewing angle, thereby causing what is referred in the present application as lack of "color stability". The result of implementing the idea of the invention is two-fold: not only such implementations substantially transmit IR light in the spectral wavelength band exceeding 1.0 micron or 1.1 micron (which is required for proper operation of, for example, typical photo-voltaic, PV, cells, as is well recognized by a skilled artisan), but the optical characteristics of the implementations in the visible portion of the spectrum are aimed to be substantially monotonic and/or substantially lacking a spectral shift of the narrow reflection peaks (that is, lacking the behaviour characterizing interference filters of related art).

According to the idea of the invention and as described herein, to achieve the desired performance, the interference filter portion of the claimed article of manufacture is specifically structured to be spatially-asymmetric that is, to contain the spatially-alternating layers of high- and low-refractive index the thicknesses of which not only are not repeated, but also do not correspond to the quarter-wave optical layers conventionally-used in related art.

The resulting implementations address and solve practical shortcomings demonstrated in operation of glazing panes used in related art. Specifically, the discussed below embodiments (utilizing coloured laminated glazing—preferably, but not exclusively, employing glass) with enhanced visually-perceived masking of the structures disposed behind such glazing units, operationally-acceptable stability of colour of reflected light as a function of angle (that is operationally-sufficient, reduced range of change of such colour as a function of angle), mechanical stability and energy-relate parameters of operation.

Figure 3A:
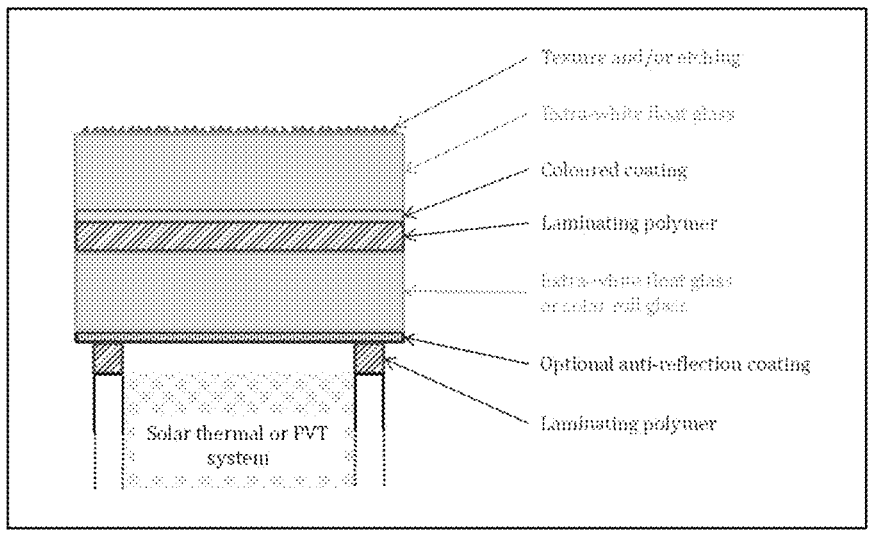
FIGS. 3A, 3B, and 3C are schematic drawings of examples of configurations of coloured laminated glazing units and/or articles of manufacture incorporating such units for solar thermal and PVT applications. The coloured coating can be deposited on the back side of the outer substrate (as shown—pane of glass), FIG. 3A; on a side of a polymeric film that is encapsulated between two substrates (as shown—glass panes), FIG. 3B; and on the front side of the inner substrate (as shown a pane of glass).

Several schematic diagrams illustrating non-limiting examples of a proposed structure of the coloured laminated glazing system(s) or articles of manufacture employing such system(s) are presented in FIGS. 3A, 3B, 3C, 4A, 4B, and 4C (in each of which the top of the Figure corresponds to the space from which the solar energy impinges onto the embodiment, while the solar thermal or PVT system is shown to be disposed at the back side of the embodiment) and generally are represented by a combination of:

An encapsulated coloured interferential multi-layered non-quarter-wave-based thin-film coating, deposited on the back side of a front glass pane (indicated as "extra-white float glass in the examples presented in these Figures; FIGS. 3A, 4A), on the back side or the front side of a polymeric film that may be encapsulated between two glass panes (as in examples of FIGS. 3B, 4B), or on the front side of the inner or rear glass pane (as in FIGS. 3C, 4C); and/or A textured or non-textured diffusive outer surface; and/or An optional anti-reflection coating applied on the back side of the inner (rear) glass pane, which may provide certain advantages for thermal or PVT applications.

As part of the overall article of manufacture, the solar thermal or PV system can be mounted/disposed behind (with or without a spatial gap) or even be directly glued to the laminated glazing unit to have the such energy-converting systems be totally integrated into the laminated-glazing-based article of manufacture.

For the purposes of this discussion and the appended claim, the identified terms identify and refer to corresponding concepts as follows (unless specifically defined otherwise):

The term "direct transmittance" identifies the situation in which parallel beams of radiation incident on a surface, an interface, or a specimen result in transmitted substantially-parallel beams (as is the case e.g., for flat or planar surfaces or interfaces). In comparison, the concept of "diffused transmittance" correspond to the case when parallel beams of radiation incident on a given surface, an interface, or a specimen are transmitted therethrough are characterized by a spatially/angularly enlarged distribution (which is case, e.g., for rough surfaces or interfaces, or for specimens of granular structure). In general, the diffuse transmittance depends on the angle of incidence and the wavelength λ of the radiation. If the angle of incidence is not explicitly mentioned, commonly normal incidence of light is assumed.

The value of "total hemispherical transmittance" is obtained by the sum of direct transmittance and diffuse transmittance:

$$T_{total} = T_{direct} + T_{diffuse} = T(\lambda) \quad (1)$$

In general, the total hemispherical transmittance is understood to depend on the angle of incidence and the wavelength λ of the incident radiation. If the angle of incidence is not explicitly mentioned, commonly normal incidence is assumed.

Given a calculated or measured spectral distribution T(λ) of the total hemispherical transmittance of a sample, the "solar transmittance" $T_{sol}$ can be determined by integrating of the total hemispherical transmittance over the solar spectrum $I_{sol}(\lambda)$:

$$T_{sol} = \frac{\int T(\lambda) \cdot I_{sol}(\lambda) d\lambda}{\int I_{sol}(\lambda) d\lambda}, \quad (2)$$

where usually the solar spectrum at air mass 1.5 (AM1.5) is employed as intensity $I_{sol}(\lambda)$, as understood in related art.

The "visible reflectance" $R_{vis}$ is, understandably, a measure of the brightness of a surface as it appears to and is perceived by an eye of a human under certain illumination conditions. A white surface or a perfect reflector exhibits 100% visible reflectance, while the values of visible reflectances of the coloured or grey surfaces are smaller. As the skilled artisan will recognize, the determination of the visible reflectance $R_{VIS}$ is based on the photopic luminous efficiency function $V(\lambda)$ and depends on the choice of the illuminant $I_{ILL}(\kappa)$:

$$R_{vis} = \frac{\int R(\lambda) \cdot I_{ILL}(\lambda) \cdot V(\lambda) d\lambda}{\int I_{ILL}(\lambda) \cdot V(\lambda) d\lambda}, \quad (3)$$

where $R(\lambda)$ is the simulated or measured spectral distribution of the total hemispherical reflectance of the sample.

When referring to the "angle of reflection" or $\theta_r$, the angle formed by a ray of light reflected from a surface and a line that is normal (perpendicular) to such surface at the point of reflection is meant. Similarly, the angle of incidence, $\theta_I$, and the angle of transmission, $\theta_t$, are defined according to commonly used and well-recognized in related art conventions.

As known in related art, when light passes through a given medium, some part of light energy is absorbed. This situation is conventionally defined with the use of a complex index of refraction N:

$$N = n - ik \quad (4),$$

where the real part n (known as refractive index) indicates the phase speed of light through the medium, while the imaginary part k (extinction coefficient) addresses the absorption loss of light in the material.

Generally, a treated surface is considered to be antireflective when the solar transmittance of a light beam at near-normal incidence is higher than that of a substantially identical but untreated surface.

The concept of and reference to the "CIE 1931 XYZ colour space" follows from the standards on how to quantify colours devised by the International Commission on Illumination (CIE, Commission Internationale d'Eclairage; see for example International Commission on Illumination CIE, 1986. Colorimetry. CIE publication 15.2, 2$^{nd}$ Ed., ISBN 3-900-734-00-3, Vienna). All existing colours can be represented in a plane and mapped by Cartesian coordinates, as shown in the CIE Chromaticity Diagrams. The quantification is based on the 1931 CIE Colour Matching Functions, $x(\lambda)$, $y(\lambda)$, and $z(\lambda)$, which represent the colour sensitivity of a human eye. These functions depend to some extent on the width of the observation field or a field of view (here, we will use the functions for an opening angle of) 2°.

The CIE 1976 (L*, a*, b*) colour space (or CIELAB) is the most complete to-date colour model used conventionally to describe all the colours visible to a human eye. It was developed for this specific purpose by the International Commission on Illumination, with the three parameters in the model representing the lightness of the colour L* (L*=0 yields black and L*=100 indicates white), its position is colour space between magenta and green (a*, negative values indicate green while positive values indicate magenta) and its position in colour space between yellow and blue (b*, negative values indicate blue and positive values indicate yellow).

The dominant wavelength of a colour is defined as the wavelength of the monochromatic stimulus that, when additively mixed in suitable proportions with the specified achromatic stimulus, matches the considered colour stimulus (see, for example, CIE technical Report, 2004, Colorimetry, 3d Ed., Publication 15:2004. Thus, any colour can be related to a monochromatic dominant colour $M_D$ defined by its dominant wavelength $\lambda_D$: in practice, the dominant colour is the colour perceived by a viewer observing polychromatic light in which different spectral components have different intensities.

The measure of "colour saturation" (or saturation of colour) is figure of merit identifying how different from pure grey a given colour is. (Saturation is not really a matter of light and dark, but rather how pale or strong the colour is.) The saturation of a colour is not a constant value, but it varies depending on the surrounding and in what colour the reflected light is seen, and is given by:

$$C_{ab}^* = \sqrt{(a^*)^2 + (b^*)^2} \quad (5),$$

where a* and b* are the CIE colour coordinates under daylight illuminant CIE-D65.

Considerations for Thin-film Coatings

The choice of the substrate on which the coloured coating is deposited is of main importance. In order to ensure maximum energy-conversion efficiency of the solar energy system, the substrate has to be highly transmissive (within the range of wavelengths the radiation at which will be converted; for example, up to about 1.1. microns for a Si collar cells) which limits the choices to just a few such as solar roll glass, extra-white float glass (having very low iron-content) and polymeric materials (such as polyethylene terephthalate (PET), polyethylene naphtalate (PEN), fluorocarbon polymer (PFA, FEP, ETFE, PTFE . . . ) and so on). The surface profile of the coating-carrying substrate is also an important consideration, especially for façade applications. As, per idea of the invention, substantially no colour variation of the interferential coating should be visible in reflected light, extra-white float glass and polymer materials are preferred to solar roll glass for the deposition of the coloured coating.

The coloured coating itself, that includes a multilayer interferential stacks of optically thin film layers, has to be of high solar transmittance $T_{sol}$. Thus, as absorption in the coating should be minimized, dielectric oxides are preferably chosen for fabrication of the decided-upon thin-film stacks. Among various possibilities, materials such as $SiO_2$, $Al_2O_3$, MgO, ZnO, $SnO_2$, $HfO_2$, $Nb_2O_5$, $Ta_2O_5$ and $TiO_2$ are appropriate suitable for implementation of the invention as described.

The value of visible reflectance $R_{vis}$ (that is, the percentage of light striking the glazing unit that is reflected back and provides information about the masking capability of the glazing) has to be high enough to result in a good masking effect, on the one hand, but low enough to ensure a good solar transmittance of light towards the solar energy system. In the present context of implementation of the idea of the invention, $R_{vis}$ has to be higher that 4%.

The intensity of colour of the reflected light is given by colour saturation $C_{ab}^*$, which is some implementations is chosen to be higher than 8 at near-normal angle of reflection. Some exceptions are made for grey and brown colours (which correspond respectively to strongly desaturated cold and warm colours of the colour gamut).

Figure 5:
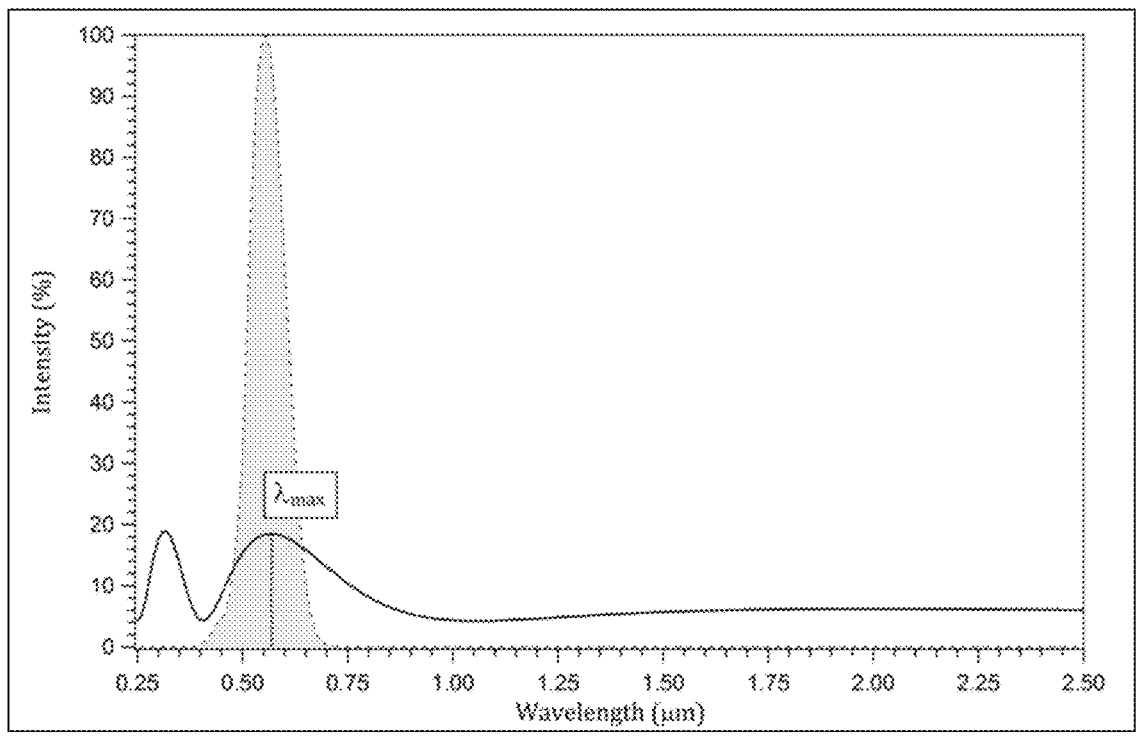
FIG. 5 illustrates a 1988 C.I.E. normalized photopic luminous efficiency function delimiting the part of the solar spectrum that is visible to the human eye, and reflectance curve at normal incidence (corresponding to the angle of vision of 0°) of a thin-film-based coating visually-perceived as a yellow-green coating ($\lambda_{max}$=570 nm) presenting a single reflection peak.
Figure 6:
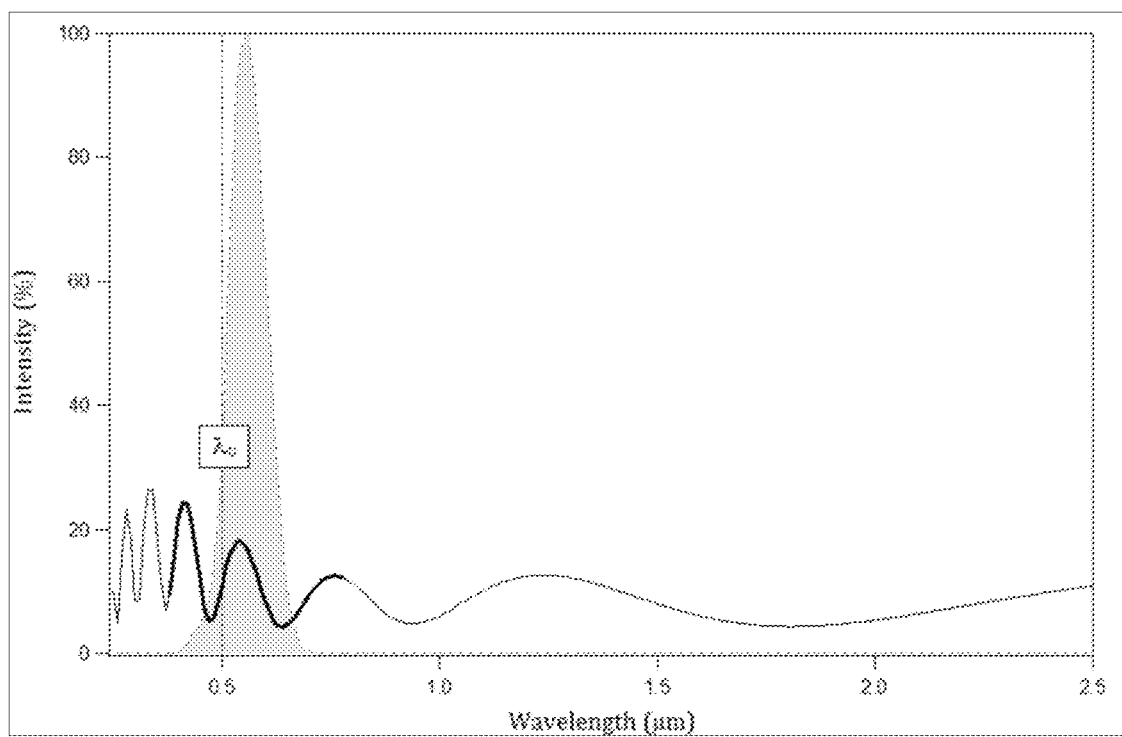
FIG. 6 illustrates a 1988 C.I.E. normalised photopic luminous efficiency function delimiting the part of the solar spectrum that is visible to the human eye, and reflectance curve at normal incidence (corresponding to the angle of vision of 0°) of a thin-film coating visually-perceived as a green coating ($\lambda_D$=500 nm) presenting three reflection peaks in the visible part of the solar spectrum.

As a result of strongly asymmetric thin-film-stack designs, discussed in the Examples below, the reflectance curves characterizing embodiments of the invention possess either a large single reflection peak (version 1) or several smaller reflection peaks (version 2). Then, the overall multilayer coating reflects a colour which is defined, as a function of the shape of the reflectance curve:

By the wavelength at which the single reflectance peak (for version 1 designs) that is situated in the visible portion of the solar spectrum has its maximum. (As a non-limiting example, FIG. 5 represents a reflectance curve at normal incidence that is, at an angle of vision of 0°—with a maximum intensity at $\lambda_{max}$=570 nm, which represents a dominant colour that is visually perceived as yellow-green for the overall "yellow-green coating" of the corresponding design); or By the combination of the wavelengths of 2 or more reflectance peaks situated in the visible spectral region. (As a non-limiting example, FIG. 6 shows a curve representing reflectance for a normal incidence of light, with 3 peaks at 413 nm, 534 nm and 742 nm. The resultant dominant colour of the corresponding "green coating" design corresponds to $\lambda_D$=500 nm, as is visually perceived as green.)

Figure 7A:
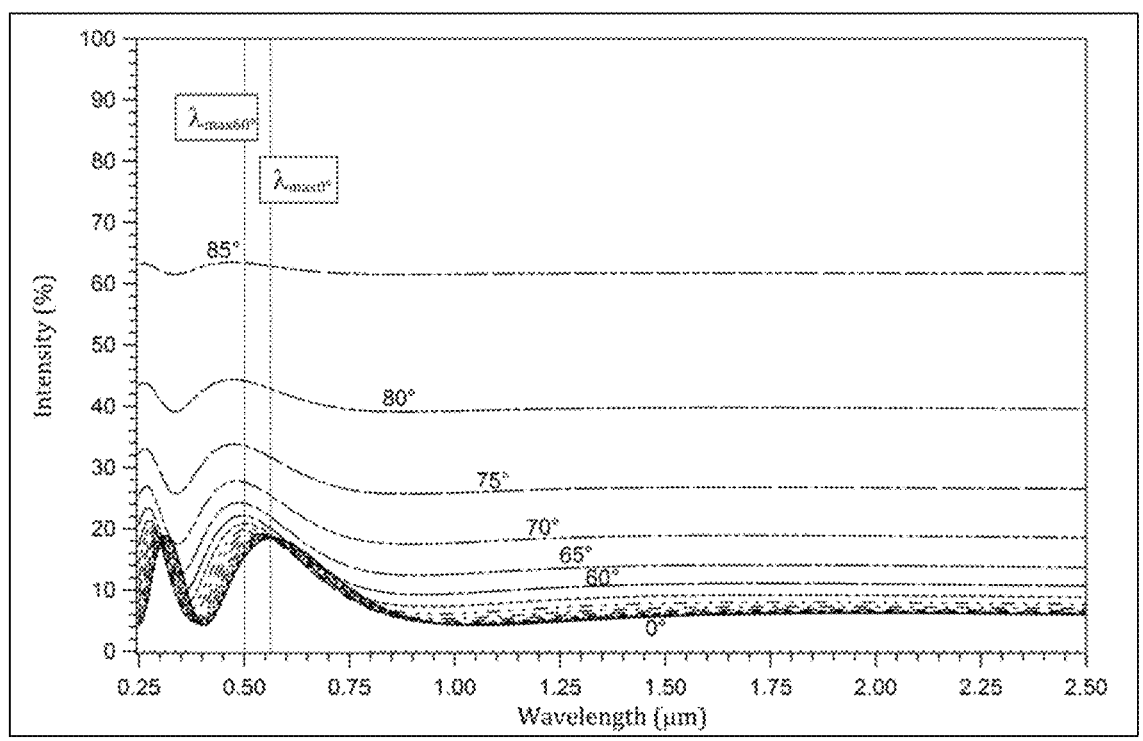
FIGS. 7A and 7B contain plots illustrating: Reflectance curves of a yellow-green coating of FIG. 5 for various angles of reflection (from 0° to 85°), FIG. 7A. Here, the reflection peak present generally in the visible part of the optical spectrum shifts to shorter wavelengths: $\lambda_{max}$ varies from $\lambda_{max\ 0°}$=570 nm at about zero-degree angle of reflection to $\lambda_{max\ 60°}$=500 nm at a 60 degree angle of reflection, thereby leading to a colour change of the coating from yellow-green to green as perceived in reflection by a human.
Figure 7B:
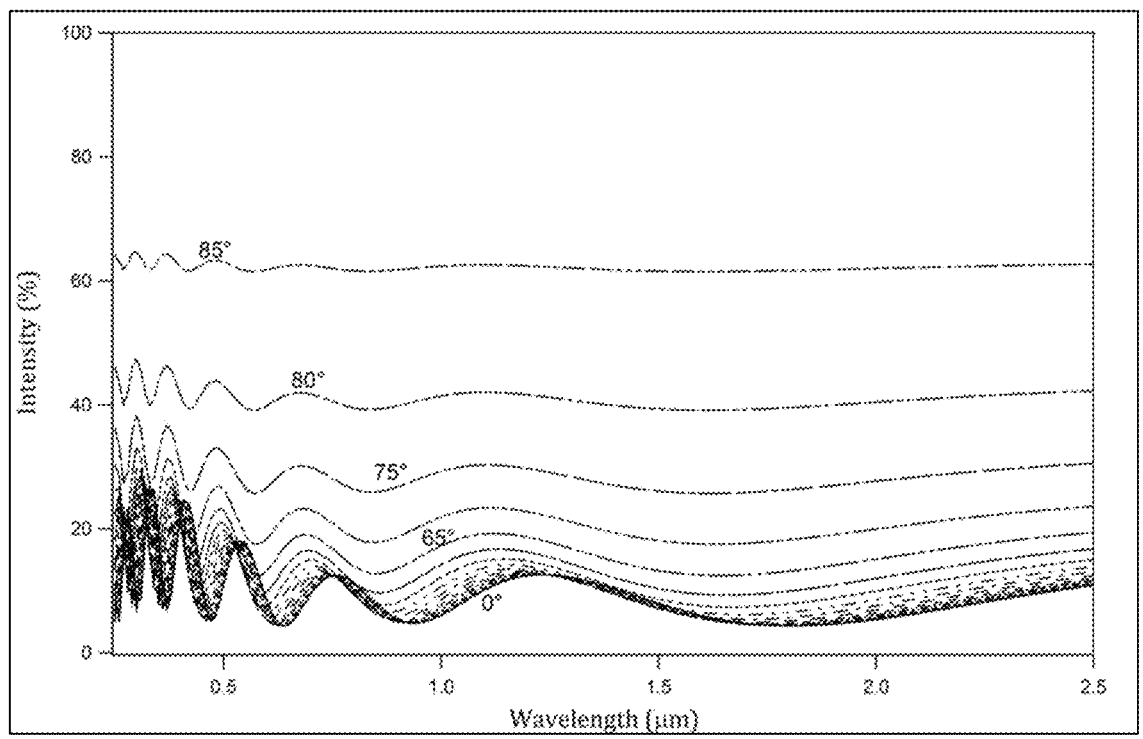

As a skilled artisan readily recognizes, with increasing angle of vision, most features of a given spectrum of reflected light shift to shorter wavelengths, inducing a modification of the position of $\lambda_{max}$ and thus of the dominant colour of a given coating. As example, the reflectance curves obtained for both yellow-green and green coatings of FIGS. 5 and 6 for various angles of reflection Or (ranging from 0° to 85°) are given in FIGS. 7A and 7B, respectively.

Figure 8A:
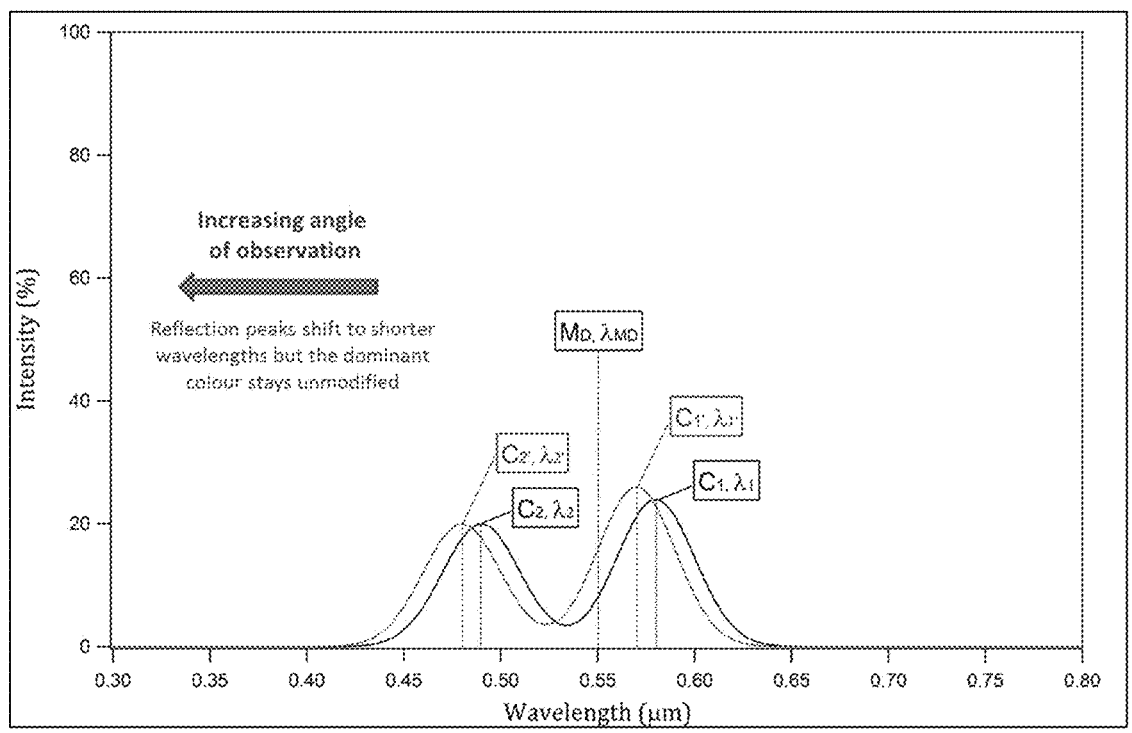
FIG. 8A is a graphical representation of a fictive reflectance curve composed by two reflection peaks in the visible part of the solar spectrum. $\lambda_1$, $C_1$ and $\lambda_2$, $C_2$ are the wavelengths and colours of the reflectance peaks perceived at low viewing angle. $\lambda_{1'}$, $C_{1'}$ and $\lambda_{2'}$, $C_{2'}$ are the corresponding wavelengths and colours at higher angle of observation. The dominant colour $M_D$ of the coating is situated at $\lambda_D$ that is located $\lambda_1$ and $\lambda_2$, its position depending on the relative intensity/irradiance of the two corresponding reflection peaks.
Figure 8B:
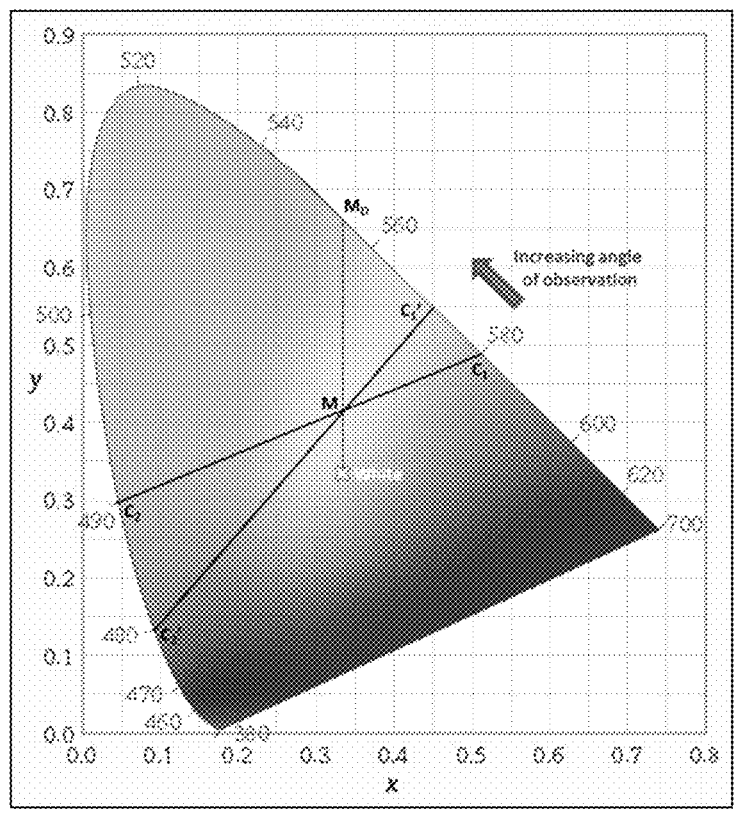
FIG. 8B illustrates the principle of colour stability with the use of the 1931 C.I.E. chromaticity diagram. M is the resultant colour of a coating characterised by two reflection peaks, in the visible part of the solar spectrum, defined by $C_1$ and $C_2$ as visualized at low angle of vision. $C_{1'}$, and $C_{2'}$ are the corresponding colours observed at the higher angle of vision. $M_D$ is the dominant colour of M.

One of the goals of implementing the idea of the present invention to ensure that coloured glazing unit is characterized by good angular colour stability, which as was already alluded to above—is of high importance for building integration of the solar energy systems. The principle of the colour stability can be explained as follows. Generally, the colour M provided in light reflected from or by a material layer can be regarded as a mixture of several colours, depending on the shape of the corresponding reflectance curve. Consider, for example, in reference to FIG. 8A, a fictive coloured material coating layer characterized by two reflection peaks in its reflection curve, in the visible part of the solar spectrum (here, the wavelengths and colours are denoted respectively $\lambda_1$, $C_1$ and $\lambda_2$, $C_2$). The colour M is defined by a dominant colour $M_D$ whose wavelength $\lambda_{MD}$ lies between $\lambda_1$ and $\lambda_2$, with its position depending on the relative intensities of both reflection peaks, FIG. 8B). With increasing angles of vision, the reflection peaks shift to shorter wavelengths. It will be appreciated that, in order to conserve the position of the point M on the colour map of FIG. 8B (that is, in order for the outside observe to not see changes of colour of light reflected by the coating as the observer looks at the coating at different angles), the shift of $C_1$ to $C_{1'}$ has to be compensated by an equivalent shift of $C_2$ to $C_{2'}$ as well as by a modification of the relative intensities of the reflection peaks in order to conserve the position of the point M. At least, the point M has to be kept on the colour segment defined by the line M-$M_D$. In this latter case, the dominant colour of the coating remains the same. According to the idea of the invention, the required practical compensation is achieved by choosing carefully the nature and the thickness of the materials of the individual layers of the thin-film stack.

Figure 9A:
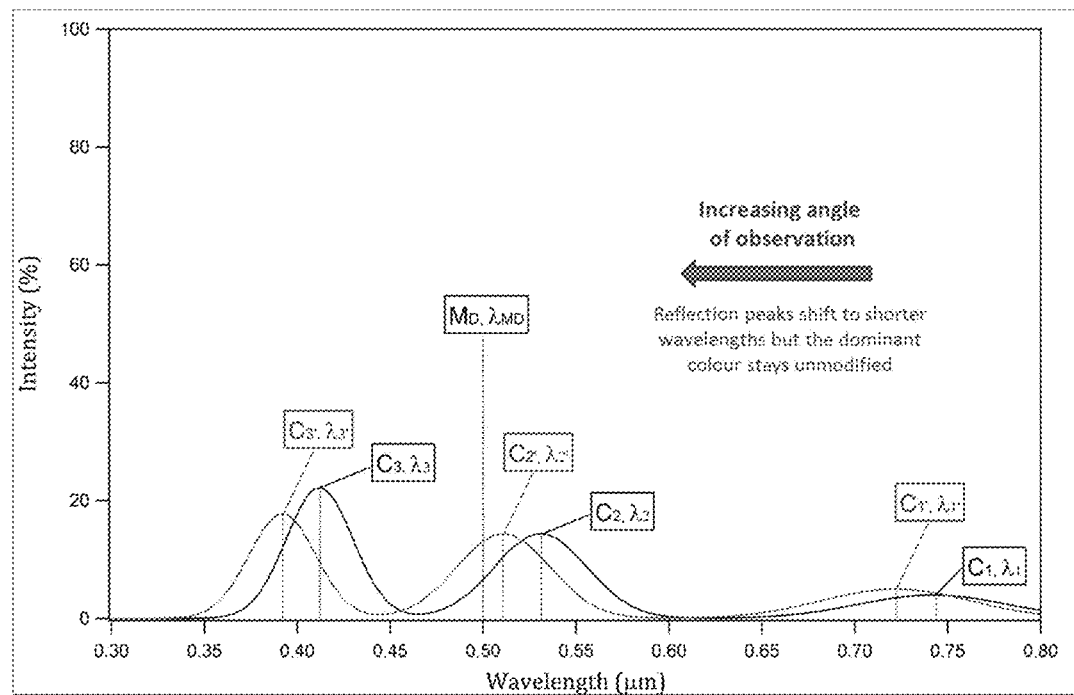
FIG. 9A: Graphical representation of a fictive reflectance curve composed by three reflection peaks in the visible part of the solar spectrum. $\lambda_1$, $C_1$, $\lambda_2$, $C_2$ and $\lambda_3$, $C_3$ are the wavelengths and colours of the reflectance peaks at low viewing angle. $\lambda_{1'}$, $C_{1'}$, $\lambda_{2'}$, $C_{2'}$ and $\lambda_{3'}$, $C_{3'}$ are the corresponding wavelengths and colours at higher angle of observation. The dominant colour $M_D$ of the coating is situated at $\lambda_D$ whose position depends on the relative intensity of all reflection peaks.
Figure 9B:
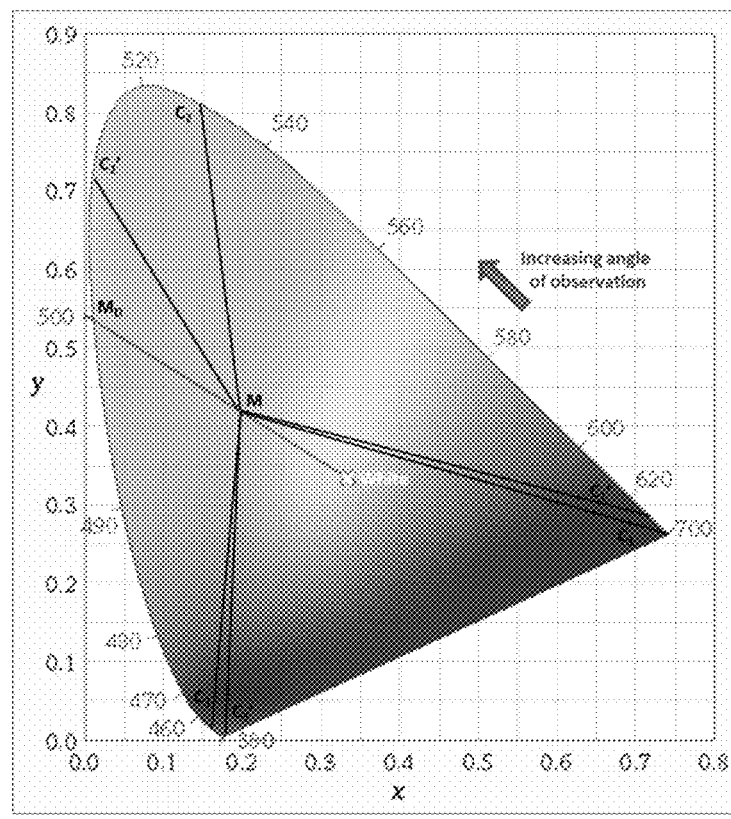
FIG. 9B illustrates the principle of colour stability with the use of the 1931 C.I.E. chromaticity diagram. M is the resultant colour of a coating characterised by 3 reflection peaks, in the visible part of the solar spectrum, defined by $C_1$, $C_2$ and $C_3$ at low angle of vision. $C_{1'}$, $C_{2'}$ and $C_{3'}$ are the corresponding colours for higher angle of vision. $M_D$ is the dominant colour of M.
Figure 10:
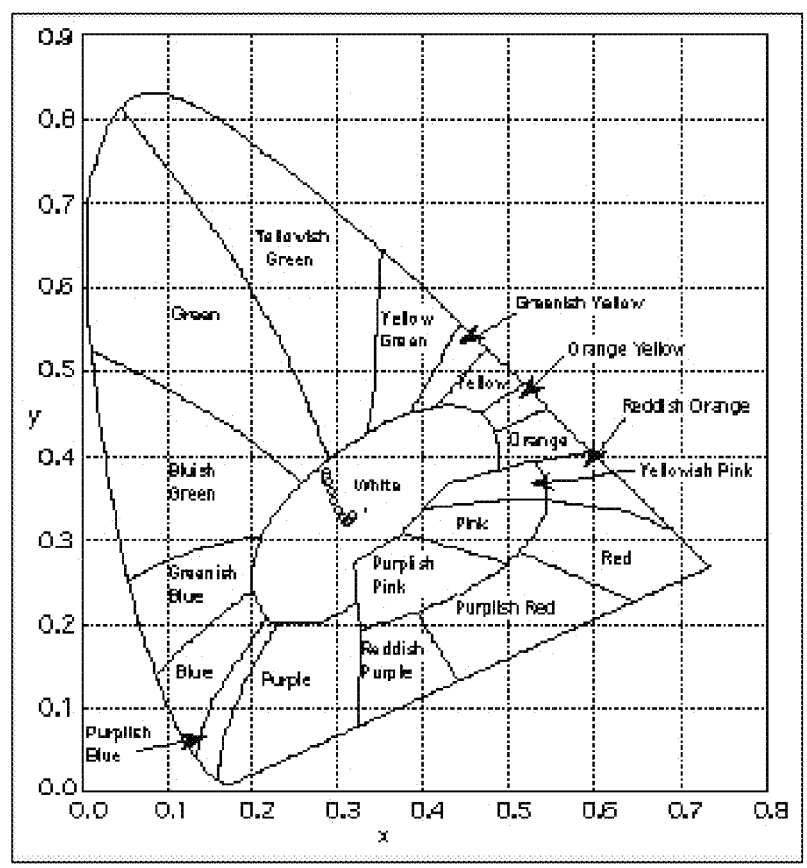
FIG. 10 illustrates the angular stability of 1931 CIE (x, y) colour coordinates under CIE-D65 illuminant of the embodiment of Example 2.
Figure 11:
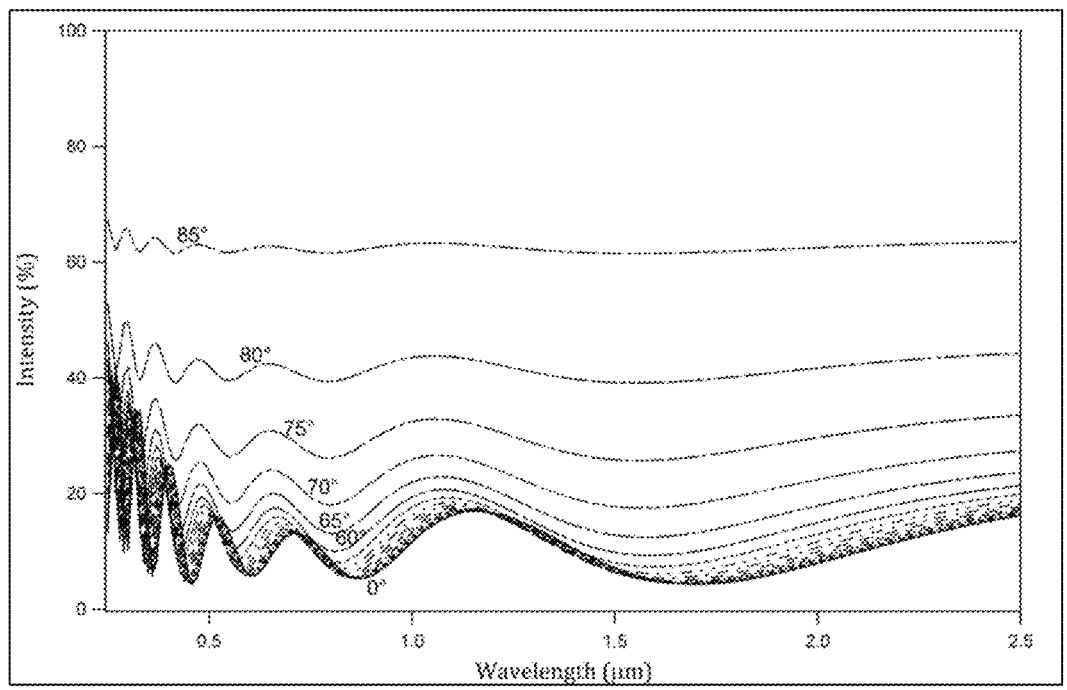
FIG. 11 illustrates reflectance curves of the embodiment of the coating of Example 2 for various angles of reflection (from 0° to 85°).
Figure 12:
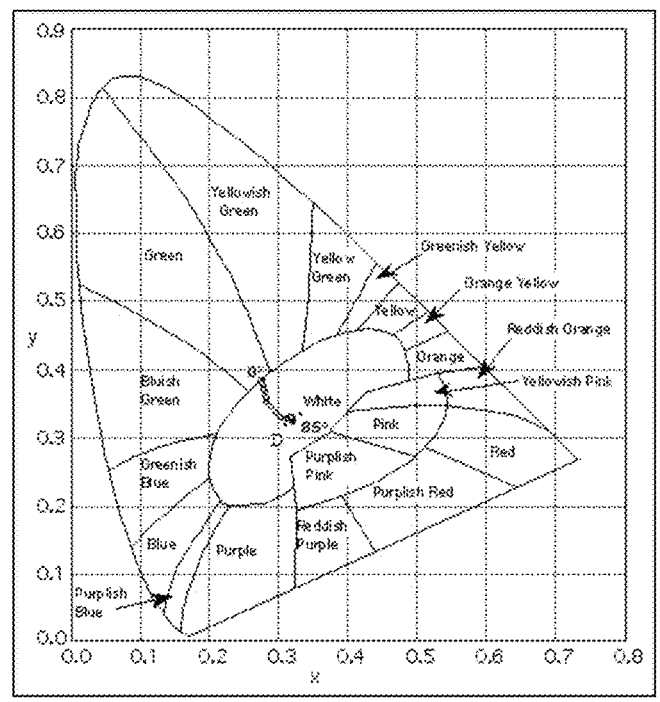
FIG. 12 illustrates the angular stability of 1931 CIE (x, y) colour coordinates under CIE-D65 illuminant of the embodiment of Example 3.
Figure 13:
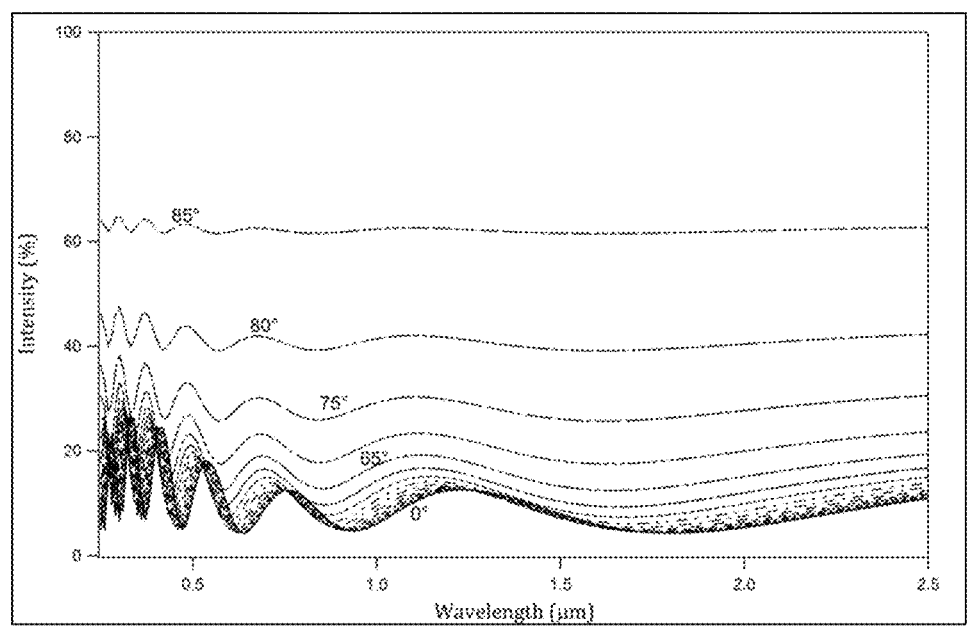
FIG. 13 provides reflectance curves of the embodiment of the coating design of Example 3 for various angles of reflection (from 0° to 85°).
Figure 14:
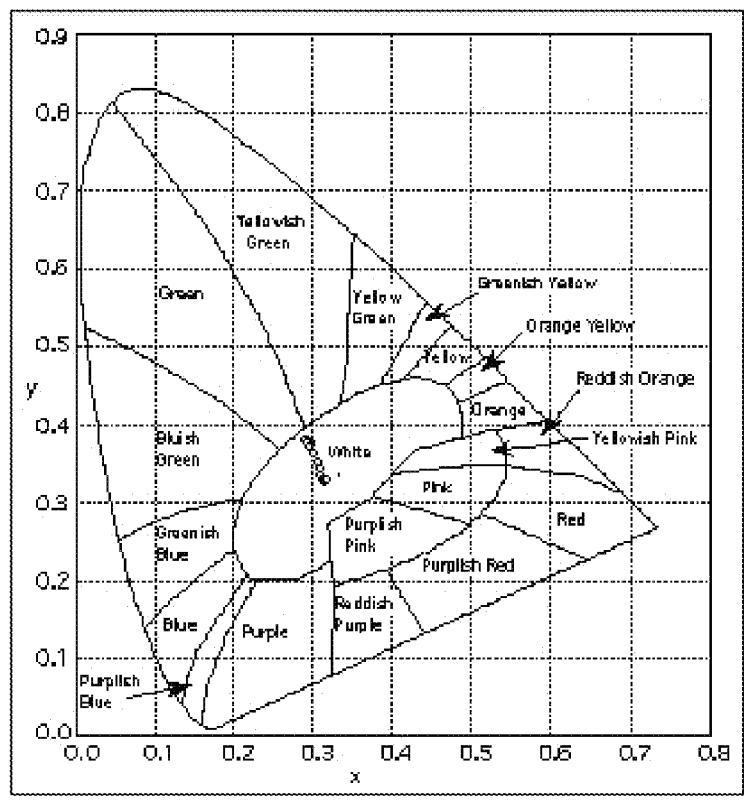
FIG. 14 illustrates the angular stability of 1931 CIE (x, y) colour coordinates under CIE-D65 illuminant of the article of manufacture containing the coating of Example 4.
Figure 15:
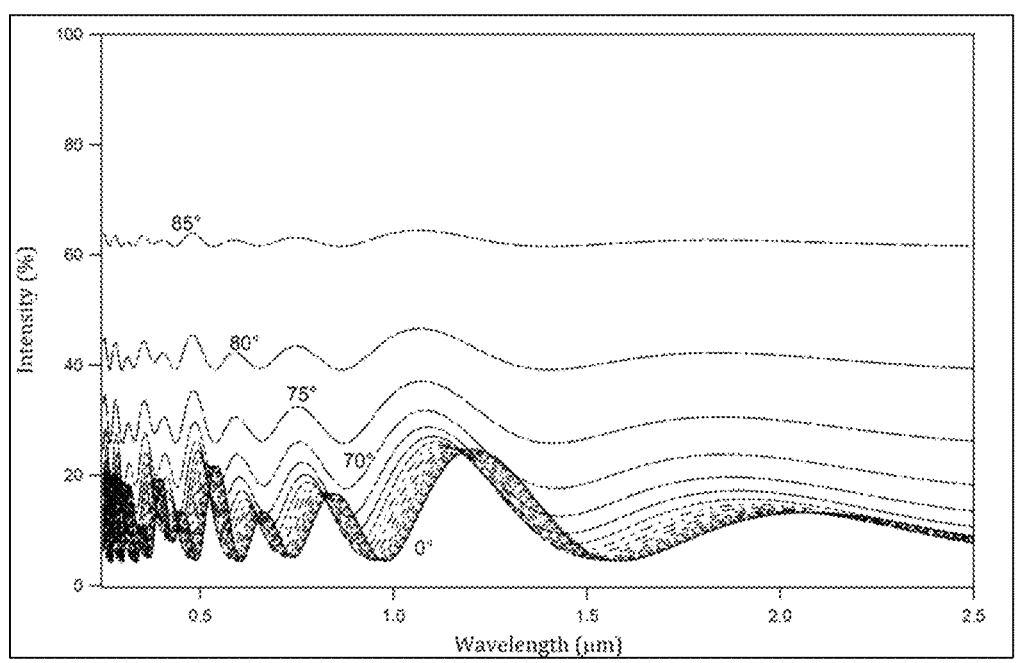
FIG. 15 provides reflectance curves of the coating design of Example 4 for various angles of reflection (from 0° to 85°).
Figure 16:
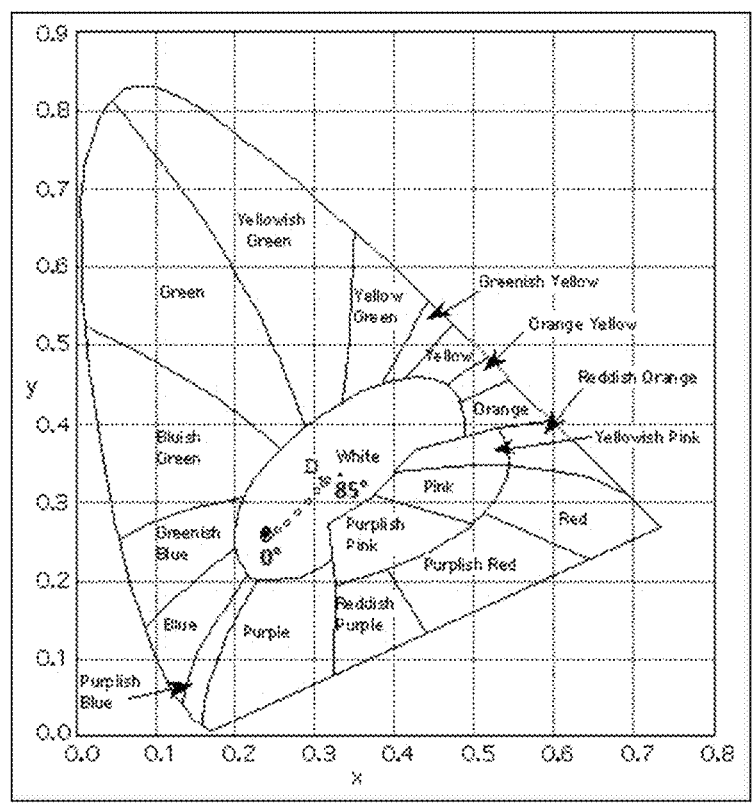
FIG. 16 illustrates the angular stability of 1931 CIE (x, y) colour coordinates under CIE-D65 illuminant of the article of manufacture containing the coating of Example 5.
Figure 17:
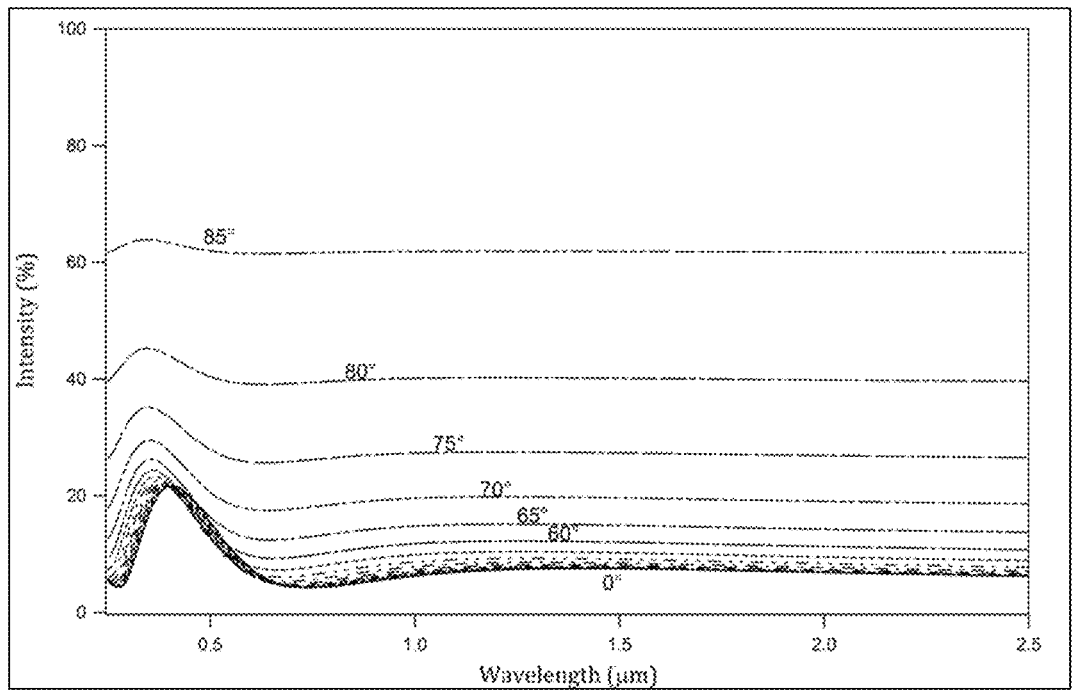
FIG. 17 provides reflectance curves of the coating design of Example 5 for various angles of reflection (from 0° to 85°).
Figure 18:
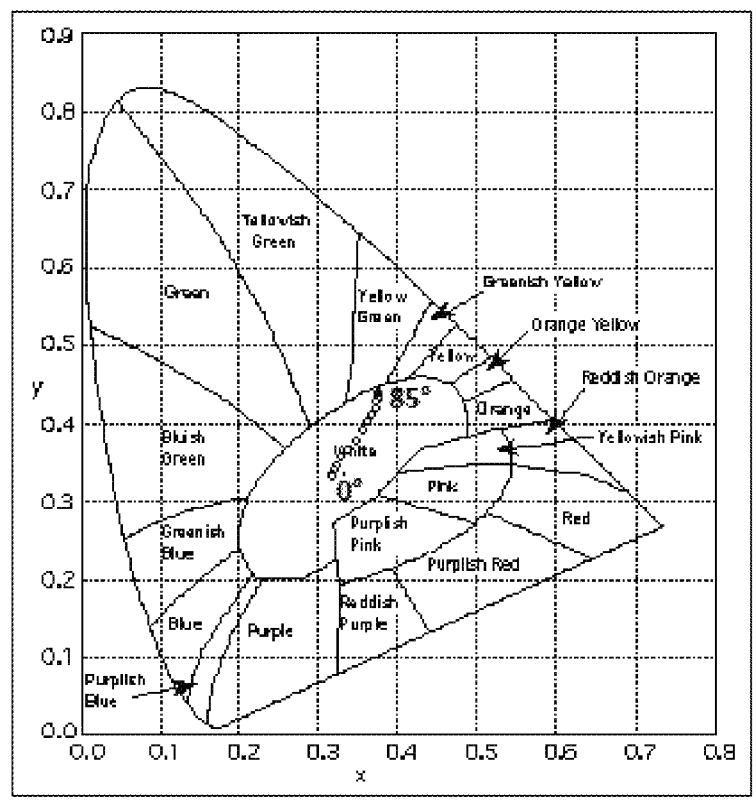
FIG. 18 illustrates the angular stability of 1931 CIE (x, y) colour coordinates under CIE-D65 illuminant of embodiment of Example 6.
Figure 19:
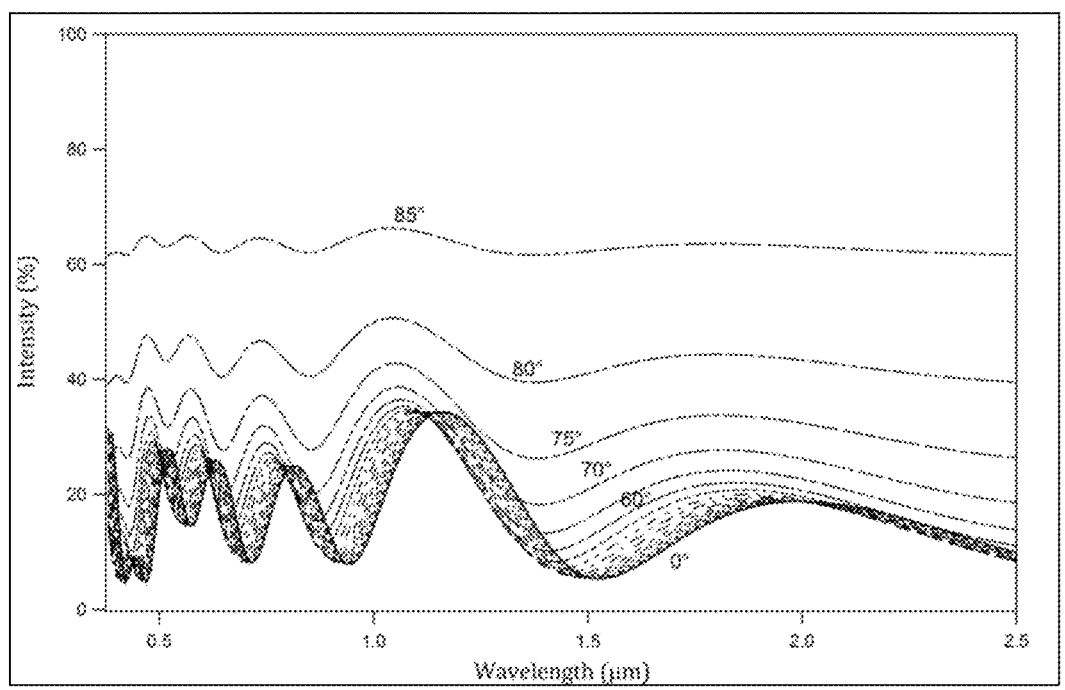
FIG. 19 provides reflectance curves of the embodiment of Example 6 for various angles of reflection (from 0° to 85°).
Figure 20:
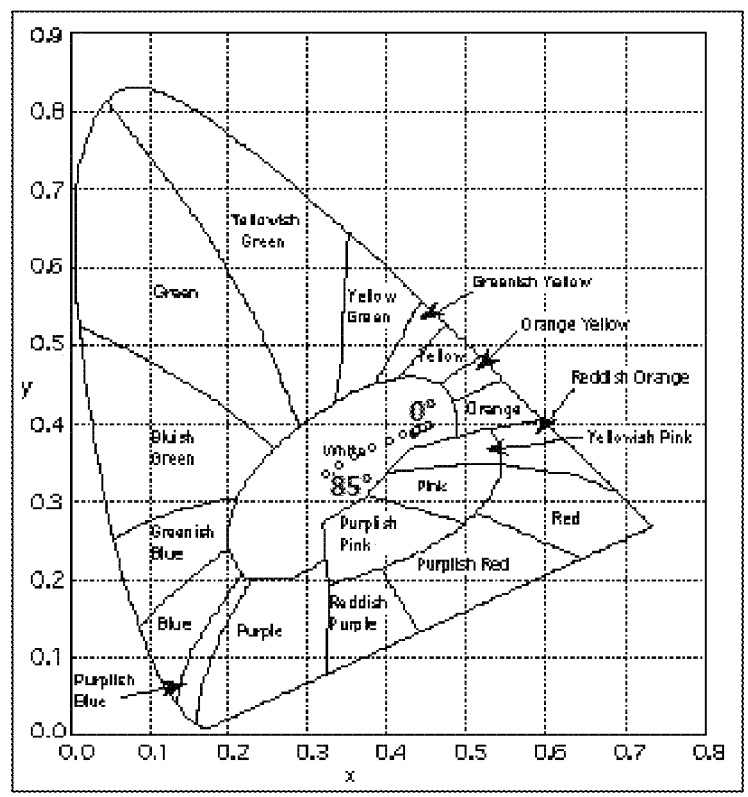
FIG. 20 illustrates the angular stability of 1931 CIE (x, y) colour coordinates under CIE-D65 illuminant of the embodiment of Example 7.
Figure 21:
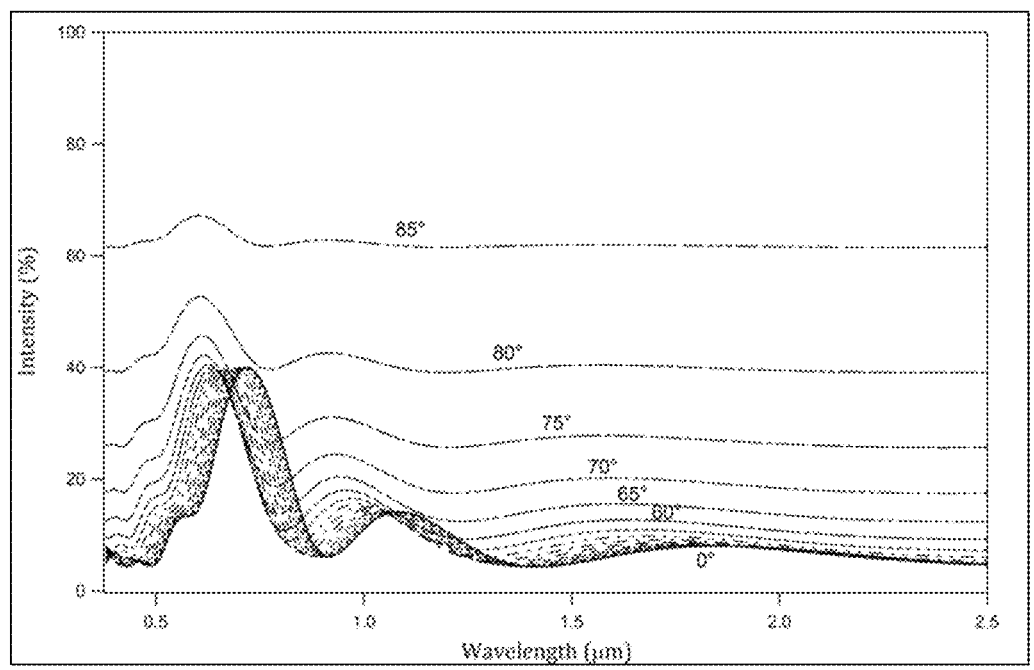
FIG. 21 provides reflectance curves of the embodiment of the coating of Example 7 for various angles of reflection (from 0° to 85°).
Figure 22:
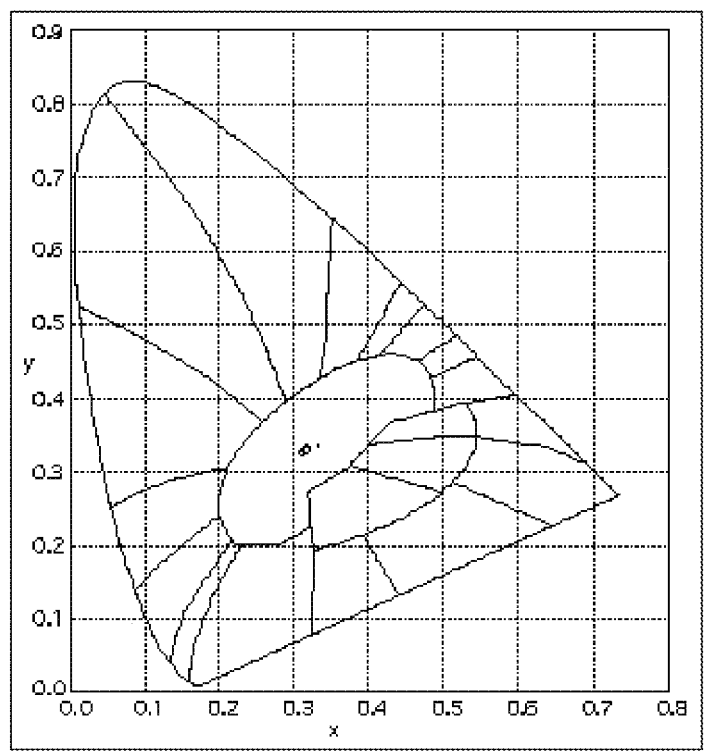
FIG. 22 illustrates the angular stability of 1931 CIE (x, y) colour coordinates under CIE-D65 illuminant of the embodiment of Example 8.
Figure 23:
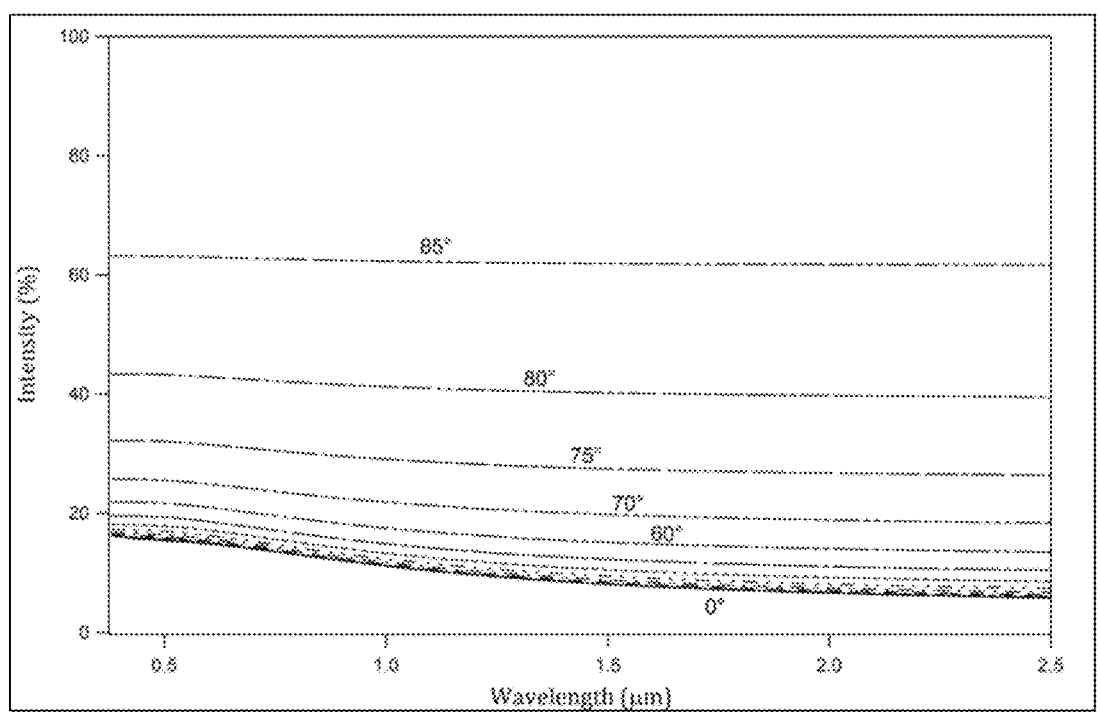
FIG. 23 provides reflectance curves of the embodiment of the coating of Example 8 for various angles of reflection (from 0° to 85°).
Figure 24:
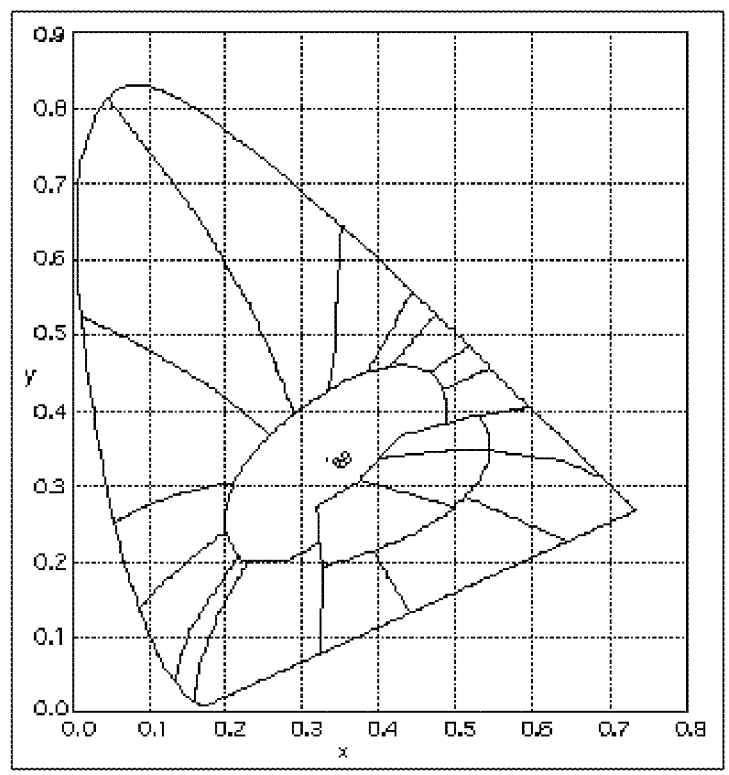
FIG. 24 illustrates the angular stability of 1931 CIE (x, y) colour coordinates under CIE-D65 illuminant of the embodiment of Example 9.
Figure 25:
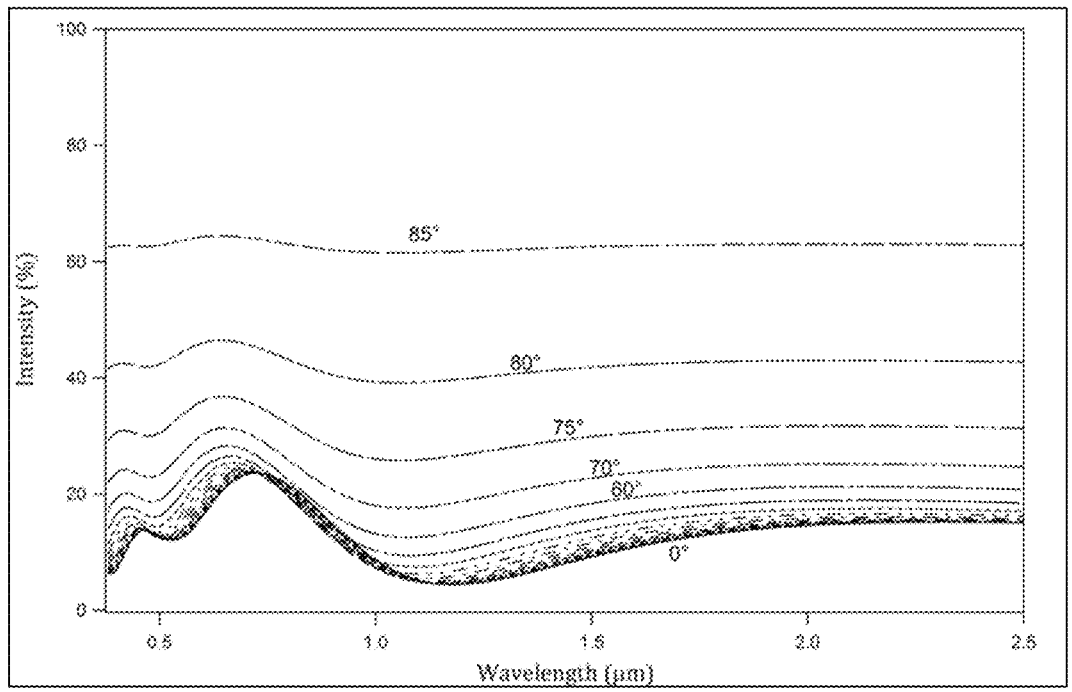
FIG. 25 demonstrates reflectance curves for the embodiment of Example 9 for various angles of reflection (from 0° to 85°).

This principle is readily extrapolated to more complex designs of the coating stacks that possess more than two peaks of reflection (see FIGS. 9A, 9B). In the plot of FIG. 9A, $\lambda_1$, $C_1$, $\lambda_2$, $C_2$ and $\lambda_3$, $C_3$ are the wavelengths and colours of the reflectance peaks at low viewing angle; $\lambda_{1'}$, $C_{1'}$, $\lambda_{2'}$, $C_{2'}$, and $\lambda_{3'}$, $C_{3'}$ are the corresponding wavelengths and colours at higher angle of observation of the coating. The dominant colour $M_D$ of the coating corresponds $\lambda_{MD}$ the position of which depends on the relative intensity of all present reflection peaks. FIG. 9B provides an illustration to the principle of colour stability with the use of the 1931 C.I.E. chromaticity diagram. Here, M is the resultant colour of the coating characterized by 3 reflection peaks of FIG. 9A. $M_D$ is the dominant colour.

Embodiments of Examples 2, 3, and 4 of the present invention successfully achieve the desired goal of substantial colour stability of reflected light. FIGS. 10, 12, 14 and FIGS. 11, 13, 15—as well as summary of data in Tables 2, 3, and 4—provide the description of optical characteristics of such embodiments: the demonstration of angular stability of colour of reflected light, the reflectance curves, and complementary information, respectively. The (x,y) colour coordinates under CIE-D65 illuminant, the visible reflectance $R_{vis}$, the solar transmittance $T_{sol}$, the dominant wavelength $\lambda_{MD}$ and colour $M_D$ and colour saturation $C_{ab}^*$ of the coatings of Examples 2, 3, and 4 are given for different angles of reflection. For each design, only small variations in colour and in reflectance (especially for $\theta_r$ up to 60°) are observed in combination with high solar transmittances (above 80% up to 60°). The variation of the wavelength of the dominant colour observed for these coating designs (for instance, 9 nm of variation between 0° and 60° for Example 2) is almost 4 times lower than that of the conventional structure of the related art described in Example 1 of WO 2004/079278.

Moreover, the embodiments of Examples 2, 3, and 4 provide yet another practical advantage over the conventional, quarter-wave-stack-based designs in that the relatively thick $SiO_2$ coatings used in conventional implementations have been replaced by layers of oxides of different materials that lend themselves to deposition at higher speed than that practically acceptable for deposition of $SiO_2$. (Since multilayer interferential stacks are deposited on industrial scale with the use of in-line magnetron sputtering, the requirements of low-cost production requires that the number of sub-layers and the thickness of the individual layers be limited.)

Additional examples of embodiment characterized by different dominant colours in reflection (blue, yellow-green, yellowish-orange, grey and brown) are itemized in Examples 5, 6, 7, 8, and 9 (and corresponding FIGS. 16, 17, 18, 19, 20, 21, 22, 23, 24, and 25 as well as Tables 5, 6, 7, 8, and 9).

As demonstrated by these Examples, the scope of the invention includes, for example, a laminated glazing unit for architectural integration of solar energy systems. Such glazing unit contains a layered glazing structure that includes (a) a substrate having a substrate refractive index $n_{sub}$, a value of which at a target wavelength of 550 nm is between 1.45 and 1.6, and (b) a multi-layered interference filter disposed on a first surface of the substrate and containing a non-quarter-wave thin-film stack defined at the target wavelength. (Here, thicknesses of any two high-index material layers sandwiching an immediately-adjacent low-index material layer therebetween are different from one another, and thicknesses of any two low-index material layers sandwiching an immediately-adjacent high-index material layer therebetween are different from one another as well. In addition, the high-index layers each have a refractive index in a range from 1.8 to 2.5 and the low refractive index layers each have a refractive index in a range from 1.4 to 2.2.) The glazing unit also includes (c) a laminating polymer layer disposed on the multi-layered interference filter (here, the laminating polymer layer has a polymer refractive index $n_{pol}$ a value of which at the target wavelength is between 1.45 and 1.6). Such layered glazing structure (when the substrate is in contact with an incident medium having a refractive index of $n_{inc}$=1) is characterized by: a first reflectance value (for IR light at every wavelength between 1 micron and 2.5 micron) between 65% and 17% for at least angles of reflection of zero degrees, -65 degrees, 70 degrees, 75 degrees, 80 degrees, and 85 degrees. In a specific case, the multi-layered interference filter includes a thin-film stack of up to 9 layers that have corresponding physical thicknesses of up to 400 nm, while materials of these layers have corresponding extinction coefficients k not exceeding 0.2 at every wavelength between 450 nm and 2,500 nm. In substantially every of implementations discussed in Examples 2 through 9, at least one of the following conditions is satisfied: (i) the first reflectance value for IR light at every wavelength between 1 micron and 2.5 micron is between 65% and 13.3% for at least the angles of reflection of said IR light of zero degrees, 65 degrees, 70 degrees, 75 degrees, 80 degrees, and 85 degrees; (ii) the first reflectance value for IR light at every wavelength between 1 micron and 2.5 micron is between 65% and 12.6% for at least the angles of reflection of said IR light of zero degrees, 65 degrees, 70 degrees, 75 degrees, 80 degrees, and 85 degrees; (iii) the first reflectance value for IR light at every wavelength between 1 micron and 2.5 micron is between 20% and 13.2% for at least the angles of reflection of said IR light of zero degrees, 60 degrees, and 65 degrees; (iv) the first reflectance value for IR light at every wavelength between 1.24 micron and 2.5 micron is between 12% and 6.1% for at least an angle of reflection of said IR light of zero degrees; and (v) the first reflectance value for IR light at every wavelength between 1.24 micron and 2.5 micron is between 17% and 4.35% for at least the angle of reflection of said IR light of zero degrees.

Embodiments disclosed in reference to Examples 10, 11, 12, and 13 (the characteristics of which are depicted in FIGS. 29, 30, 31, 32, 33, 34, 35, and 36 respectively, as well as summarized in Tables 10, 11, 12, and 13, respectively, complement the above-discussed initial embodiments by demonstrating that the stated operational characteristics of the embodiment of the glazing units of the invention can be successfully met with structures employing materials with refractive indices defined in a wider range (and, therefore, providing access to a wider range of materials and deposition techniques for fabrication of embodiments of the invention).

For instance, and in reference to Example 10 (FIGS. 29, 30 and Table 10), the non-quarter-wave spatially-asymmetric thin-film-stack-based embodiment employing materials with $n_L$=1.25 and $n_H$=2.5 is presented, the dominant colour of which is reflected visible light is perceived as being contained to the yellow/greenish-yellow portion of the optical spectrum (the range of change of dominant wavelength of light reflected across the broad range of angles of reflection from 0° to 85° not exceeding 18 nm, and for the angles of reflection from 0° to 60°—not exceeding only 4 nm). The closest to the exit medium layer is that of a low refractive index. The total hemispherical transmittance (within the spectral range from 250 nm to 2,500 nm) of this embodiment is estimated to exceed 82%, depending on the type of etching surface treatment to which this embodiment may or may not be exposed. Based on the analysis of the data presented by reflectance curves of FIG. 30, the skilled artisan will readily determine that the reflectance value of the design for IR light at every wavelength between 1 micron and 2.5 microns is between 63% and 7.3% for at least the angles of reflection of the IR light of zero degrees, 15 degrees, 30 degrees, 45 degrees, 60 degrees, 70 degrees, 75 degrees, 80 degrees, and 85 degrees; and at every wavelength within the range from 1 micron to 1.4 microns such reflectance value is between 25% and 13.2% for at least the angles of reflection of the IR light of zero degrees, 1 degrees, 30 degrees, 45 degrees, and 60 degrees; and at every wavelength within the range from 1.5 microns to 2.5 microns such reflectance value is between 24.2% and 7.35% for at least the angle of reflection of the IR light of zero degrees, 15 degrees, 30 degrees, 45 degrees, 60 degrees, and 70 degrees.

Similarly, the embodiment of Example 11 (FIGS. 31, 32 and Table 11) addresses the implementation involving specifically-asymmetric non-quarter-wave thin-film stack with materials having $n_L$=2.2 and $n_H$=2.5, in which the number of thin-film layers is reduced by two as compared to the design of Example 10. This implementation demonstrates colour stability characterized by a change of the dominant colour wavelength $\lambda_{MD}$ not exceeding 22 nm, thereby presenting the sun-light, reflected by the embodiment towards the outside observer, to be visually perceived as substantially yellow-greenish within the wide range of angle of reflection from 0° to 85°. (For the range of the angles of reflectance from 0° to 60°, the color stability is characterized by the change of the dominant colour wavelength of only 5 nm.) The total hemispherical transmittance (within the spectral range from 250 nm to 2,500 nm) of this embodiment is estimated to exceed 82%, depending on the type of etching surface treatment to which this embodiment may or may not be subjected.

Example 12 (1/.25/1.8, FIGS. 33, 34 and Table 12) addresses the embodiment in which a specific spatially-asymmetric non-quarter-wave thin-film stack with materials having $n_L$=1.25 and $n_H$=1.8. This implementation demonstrates colour stability characterized by a change of the dominant colour wavelength $\lambda_{MD}$ not exceeding 3 nm within the wide range of angles of reflection from 0° to 60°, thereby causing the sun-light reflected by the embodiment towards the outside observer, to be visually perceived as substantially yellow-greenish. The total hemispherical transmittance (within the spectral range from 250 nm to 2,500 nm) of this embodiment is estimated to exceed 80% (and even 92% in a specific case, with the specific value depending on the type of etching surface treatment to which this embodiment may or may not be subjected). Based on the analysis of the data presented by reflectance curves of FIG. 34, the skilled artisan will readily determine that this embodiment of the layered glazing structure includes a multi-layered interference filter in which the high-index layers each have a refractive index from 1.8 to 2.5 and the low refractive index layers each have a refractive index from 1.25 to 2.2. Such layered glazing structure in characterized—when the substrate is in contact with an incident medium having a refractive index of $n_{inc}$=1—by a first reflectance value for IR light at every wavelength between 1 micron and 2.5 micron is between 18% and 5% for at least angles of reflection of zero degrees, 15 degrees, 30 degrees, 45 degrees, 60 degrees, 70 degrees, and 75 degrees.

Example 13 (1.8/2.2, FIGS. 35, 36 and Table 13) illustrates the embodiment in which a specific spatially-asymmetric non-quarter-wave thin-film stack with materials having $n_L$=1.8 and $n_H$=2.2. The colour stability of this implementation is characterized by a change of the dominant colour wavelength $\lambda_{MD}$ not exceeding the astonishingly low value of 1 nm within the wide range of angles of reflection from 0° to 60°, thereby causing the sun-light reflected by the embodiment towards the outside observer, to be visually perceived as having stable greenish-blue hue. The total hemispherical transmittance (within the spectral range from 250 nm to 2,500 nm) of this embodiment is estimated to exceed 80% (and even 89% in a specific case, with the specific value of such transmittance depending on the type of etching surface treatment to which this embodiment may or may not be subjected).

Figure 34:
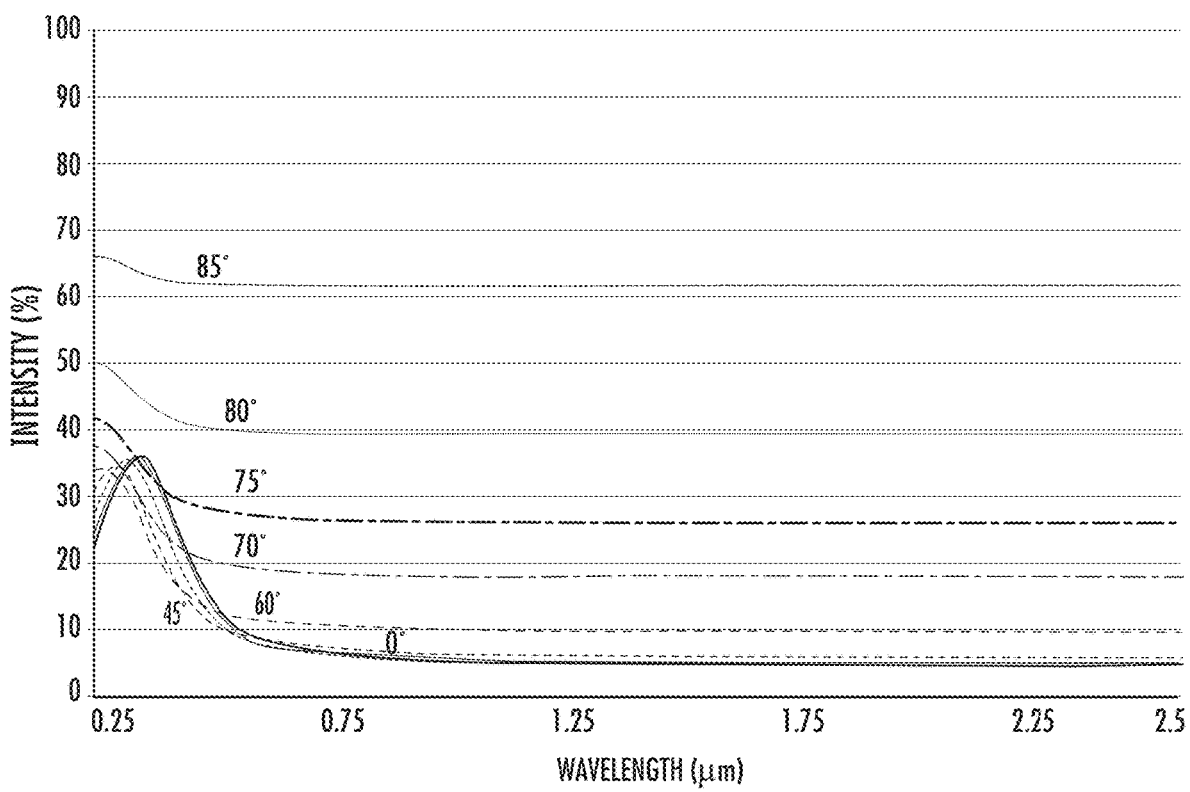
FIG. 34 demonstrates reflectance curves for the embodiment of Example 12 for various angles of reflection (from 0° to 85°).
Figure 35:
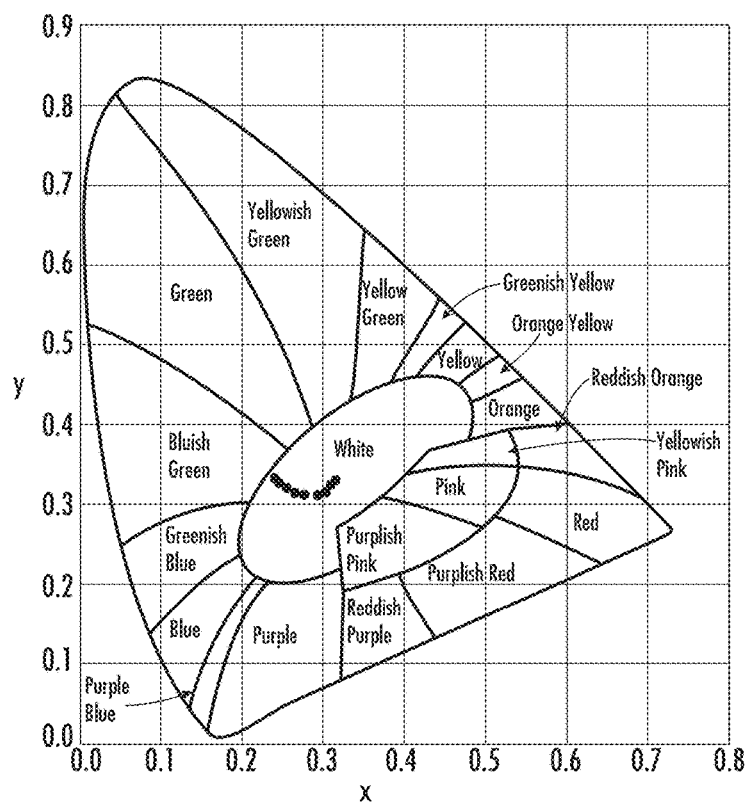
FIG. 35 illustrates the angular stability of 1931 CIE (x, y) colour coordinates under CIE-D65 illuminant of the embodiment of Example 13.
Figure 36:
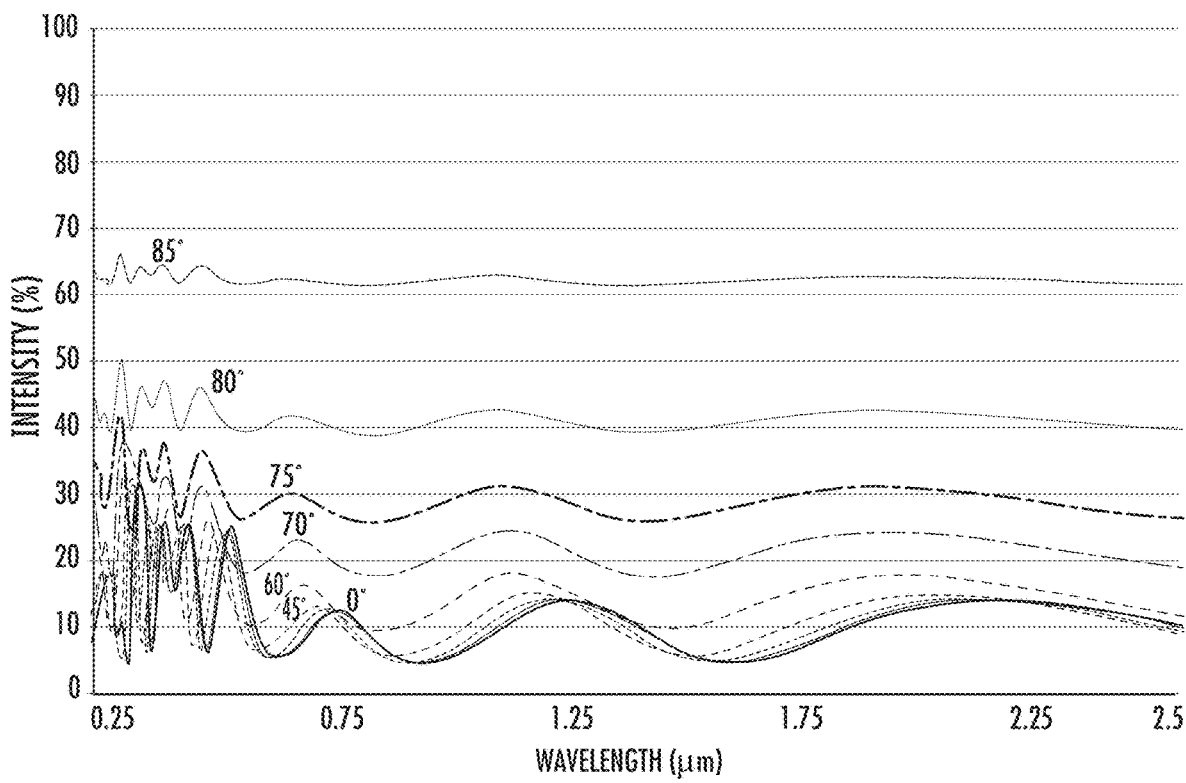
FIG. 36 demonstrates reflectance curves for the embodiment of Example 13 for various angles of reflection (from 0° to 85°).

Based on the analyses of the data presented by reflectance curves of FIGS. 34 and 36, the skilled artisan will readily determine that embodiments of both Example 12 and Example 13 include a layered glazing structure which, when the substrate of such structure is in contact with an incident medium having a refractive index of $n_{inc}=1$, is characterized by a first reflectance value for IR light at every wavelength between 1 micron and 2.5 micron is between 65% and 14% for at least angles of reflection of zero degrees, 65 degrees, 70 degrees, 75 degrees, 80 degrees, and 85 degrees. The laminated glazing unit of any of the embodiments of Examples 12, 13 provides for variation of a dominant wavelength $\lambda_{MD}$ of a dominant colour (characterizing light reflected by the laminated glazing structure in the visible portion of the optical spectrum at an angle $\theta_r$) to be smaller than at least one of a) 3 nm for every $\theta_r<60'$; and b) 1 nm for every $\theta_r<75°$.

Overall, with the now-provided Examples 2 through 13, the skilled artisan will readily appreciate that intermediate designs of thin-film stacks of the glazing units (that is, designs corresponding to specific values of refractive indices 1.8 and 2.5 (for a high-index layer of material) and between 1.25 and 2.2 (for a low-index layer of material) will result in embodiments in which a multi-layered interference filter (of the layered glazing structure of the laminated glazing unit) is disposed on a first surface of the substrate and containing a non-quarter-wave thin-film stack defined at said wavelength of 550 nm, with thicknesses of any two high-index material layers sandwiching an immediately-adjacent low-index material layer therebetween are different from one another and wherein thicknesses of any two low-index material layers sandwiching an immediately-adjacent high-index material layer therebetween are different from one another, and with the high-index layers each have a refractive index from 1.8 to 2.5 and the low refractive index layers each have a refractive index from 1.25 to 2.2. In such embodiments, the layered glazing structure—when the substrate is placed in contact with an incident medium having a refractive index of $n_{inc}=1$—is characterized by a first reflectance value for IR light at every wavelength between 1 micron and 2.5 micron is between 65% and 29% for at least angles of reflection of zero degrees, 65 degrees, 70 degrees, 75 degrees, 80 degrees, and 85 degrees.

The skilled artisan will now also readily appreciate that, generally speaking—and in reference to any embodiment from Examples 2 through 13—the characteristic of colour stability (defined by a variation of a dominant wavelength $\lambda_{MD}$ of a dominant colour, representing light reflected from the layered glazing structure in the visible portion of the optical spectrum), as well as the total hemispherical solar transmittance of a given embodiment and/or the value of saturation of colour of a given embodiment are subjects to not only the specific design of the particular thin-film stack, but also at least the conditions of lamination, the presence of a particular relief surface on the substrate of the glazing unit (caused by the surface treatment defined elsewhere in this disclosure), and geometry of illumination of a given embodiment.

Additional Processing Considerations.

(A) Deposition Techniques.

As a skilled artisan will recognize, while various deposition techniques may be found useful at least in part for fabrication of an embodiment of the glazing unit of the invention, the preferred methodology for implementing the idea of the invention is that of a physical vapour deposition (PVD) and sol-gel methods, as other deposition techniques such as CVD, PACVD, etc may not be advantageous for large-scale production and/or not precise enough to ensure good control of the thicknesses of the required coatings. Further, while both PVD and sol-gel processes can be used to produce thin-films from materials with most of refractive indices within the range 1.25-2.5 considered in the provided examples, it may be preferred to utilise sol-gel deposition for materials with very low indices (for example, n<1.45) and PCD for deposition of materials with particularly high indices (n>2.2). As a non-limiting example, Table A below lists some identified materials for fabrication of an embodiment of the invention. Whether the PVD or a sol-gel deposition is used, the final refractive index of a single material may vary depending on the machinery used and deposition conditions (see for example https://refractiveindex.info/[refractiveindex.info], Renewable Energy 53 (2013) 27-34 and Solar Energy Materials and Solar Cells, 90 (2006) 2894-2907).

TABLE A

| Approx, | Deposition method and material | |
|---|---|---|
| n at 550 nm | PVD | Sol-gel |
| 1.26 | — | nano-porous $MgF_2/SiO_2$ mixtures |
| 1.38 | $MgF_2$ | nano-porous $SiO_2$ |
| 1.42 | $SiO_2$ | $SiO_2$ |
| 1.77 | $Al_2O_3$ | $TiO_2/SiO_2$ mixtures |
| 1.79 | ZnO | |
| 1.90 | $HfO_2$ | |
| 2.14 | $Ta_2O_5$ | $TiO_2$ |
| 2.17 | $ZrO_2$ | |
| 2.36 | $Nb_2O_5$ | — |
| 2.44 | $TiO_2$ | — |

(B) Surface Treatment to Form Diffusive Surfaces and Increase Total Hemispherical Solar Transmittance of a Given System.

In certain cases, a diffusive surface treatment can be applied to or on the outer surface of the coloured laminated glazing as shown in various Examples, to the outer surface of the glass substrate, for example (which can either be extra-white float glass or solar roll glass). (The use of extra-white float glass has the advantage of possessing higher flatness figure, and for that reason may be preferred for façade applications. Both types of glass are also commercially available with a wide variety of textures and patterns applied on the outer surface.) The etching treatment is applied to diffuse transmitted light, which reinforces the masking effect of the embodiment of the coloured filter. Such treatment additionally forms matte surfaces that are often desired by architects to prevent light glare.

By choosing appropriate compositions of the etching solution, favourable micro and/or nano-sized relief structures on the surface of the treated glass can also result in anti-reflection properties. For example, the treatment of glass surfaces with acid etching in buffered solutions leads to a particular structure combining micrometric islands with nanometric openings, both uniformly distributed. The resulting low reflectance glass surfaces thus obtained are perfectly suitable for the solar applications described here.

In practice, etching solutions including at least some of the following components have been developed: ammonium bifluoride (ABF), water ($H_2O$), isopropanol (IPA), sugars (sucrose, fructose, etc.). These solutions are particularly effective over a wide range of compositions and for treatment times shorter than 20 minutes.

Non-limiting examples of effective solutions with range of reasonable concentrations include:

Solution 1: ABF/IPA/water mixture with the following proportions 10-30 wt. %/20-40 wt. %/balance.

Solution 2: ABF/sucrose/water mixture with the following proportions 15-25 wt. %/15-40 wt. %/balance.

Figure 26:
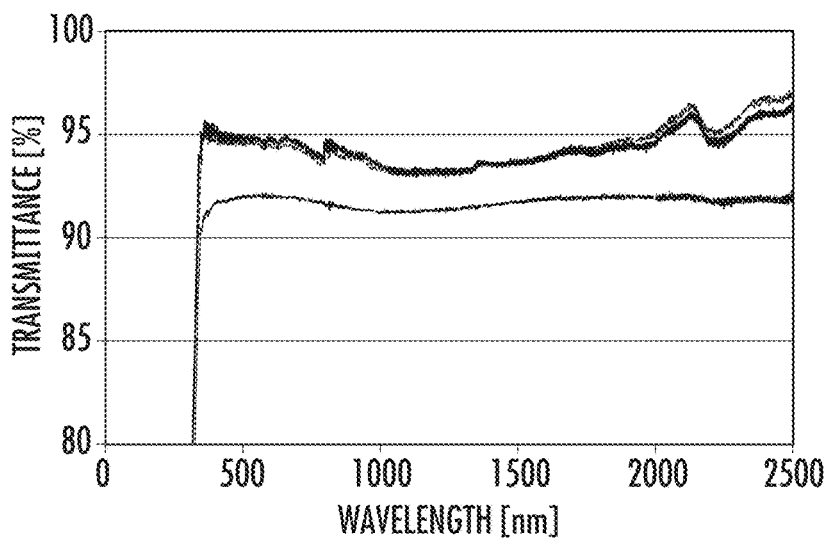
FIG. 26 provides results of measurements, at normal angle of incidence of light, of a total hemispherical transmittance of a glass pane etched with solution 1 (ABF/IPA/$H_2O$=30/10/60, 15 min etch time; middle curve), a glass pane etched with solution 2 (ABF/sucrose/$H_2O$=18/18/64; 15 min etch time; upper curve), and an untreated glass pane (lower curve). The normal hemispherical transmittance values are about 95% for both etched glass panes and about 92% for the untreated glass.

Excellent transmittance figures have been obtained for the treated glass surfaces thanks to anti-reflective properties. The measured hemispherical normal transmittance of the treated glass surfaces is about 95% as regards to 92% for an untreated glass (See FIG. 26).

Figure 27A:
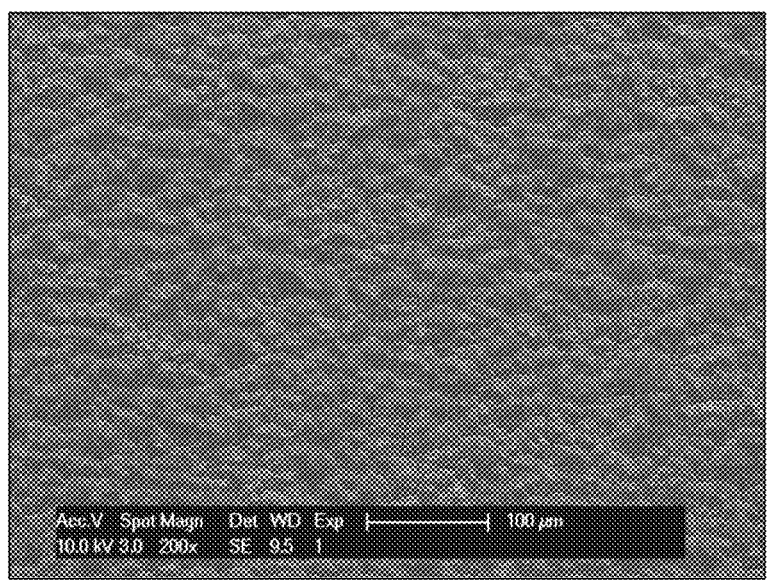
FIGS. 27A, 27B provide SEM images of glass surfaces structured with the use of the ABF-based etching solutions.
Figure 27B:
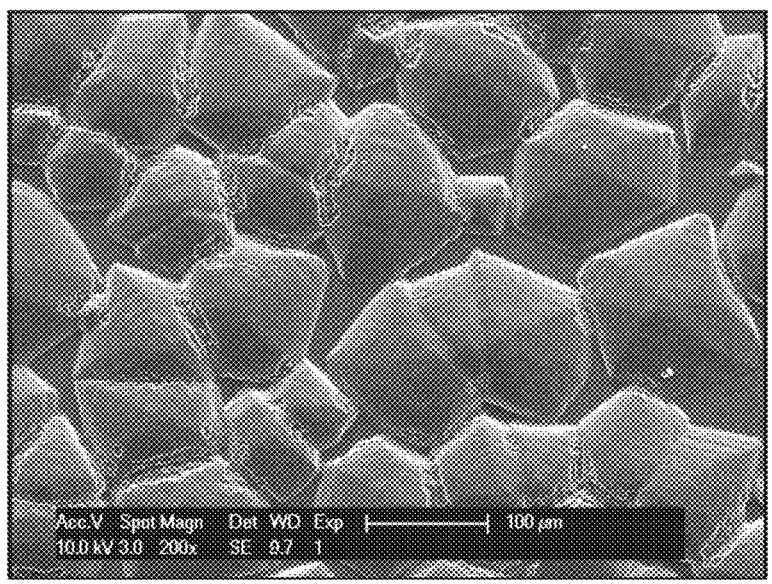

FIGS. 27A, 27B present SEM pictures of glass surfaces respectively structured by an ABF/IPA-based etching solution (ABF/IPA/$H_2O$=30/10/60) and by an ABF/sucrose-based etching solution (ABF/sucrose/$H_2O$=18/18/64). Both images have been taken after the same etching time (15 min) and with the same magnification. In the first case (FIG. 27A), the surface was relatively smooth and presents some micro-scale protrusions and furrows arising from the junction of nano-holes which are present on the entire surface. In the second case (FIG. 27B), the surface featured a much rougher structure and was densely covered with pyramidal formations. These pyramids had a height around 10 µm, were defined by different types of polygons at the corresponding base area with dimensions about 100 µm to 120 µm, and had pronounced nano-structured side walls. The measured gain in solar transmittance, demonstrated by the embodiment that have been treated with etching, can then be explained by anti-reflective properties resulting from micro-scale patterning in combination with a nano-scale roughness modification.

(C) Tempering and Lamination

After coating deposition and optional etching of a predetermined surface, the different substrate panes are tempered. There is no restriction to perform this thermal treatment, as both coloured coatings (made of oxides) and diffusive surfaces (mainly $SiO_2$) present very good thermal stabilities.

Then, the substrates (in one case—the glass panes) and, if necessary, other elements (coated polymeric film, crystalline silicon cells . . . ) are joined together by lamination. Laminating polymers are preferably, but not exclusively elastomer cross-linking products such as EVA (Ethylene-Vinyl-Acetate) or thermoplastic products such as PVB (Polyvinyl Butyral). These products are characterised by high solar transmittances, low refractive indices, and good adhesion to glass or polymer panes.

Both of these treatments are performed and combined in order to fulfil the security requirements for façade applications, but also to provide some advantages. Here, the lamination can offer the possibility to have different supply chains for coating and etching, depending on the chosen configuration (see FIGS. 3A-3C and 4A-4C) thus offering a wide time savings. Moreover, as a result of lamination, the coloured coating is physically encapsulated and fluidly sealed, thereby preventing undesirable structural change of the coating and avoiding any colour modification due to water condensation on the inner side of the glazing when the glazing unit is mounted on thermal collectors and/or during the operation.

In addition, the laminated glazing provides an advantage of good mechanical strength, which offers:

The possibility use of forming the glazing unit on a scale larger than that of the solar thermal or PVT systems (in which case the solar thermal or PVT system can be directly bonded to the back of the glazing and thus be completely hidden from the view). Since the coloured coating is encapsulated, such solar collectors can be produced substantially without any colour change along the glued collector frame (which is the case when the interferential coating is in direct contact with lamination polymer or glue). Thermal, PV and PVT systems have therefore exactly the same external appearance.

The possibility of use of glass—and not polymeric material—for the mechanical affixation of the solar devices.

Figure 28A:
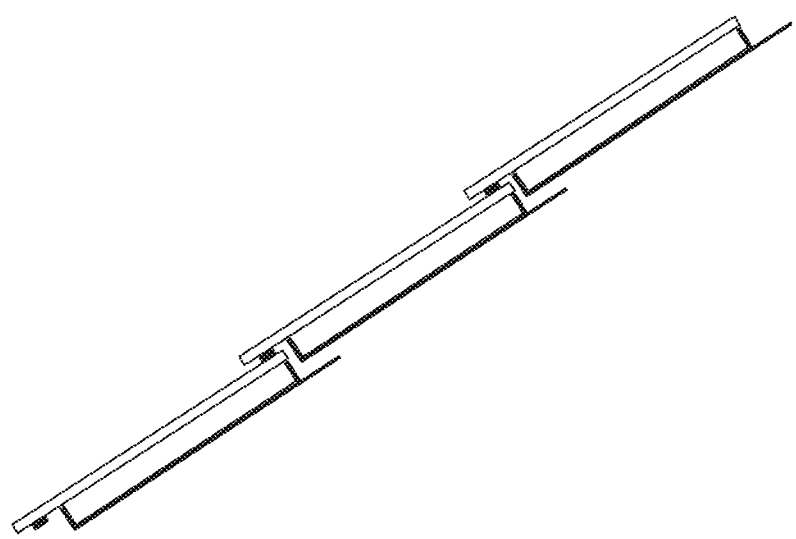
FIGS. 28A, 28B, and 28C illustrate non-limiting variants of the mounting of thermal or PVT solar systems glued behind corresponding coloured laminated glazing units.
Figure 28B:
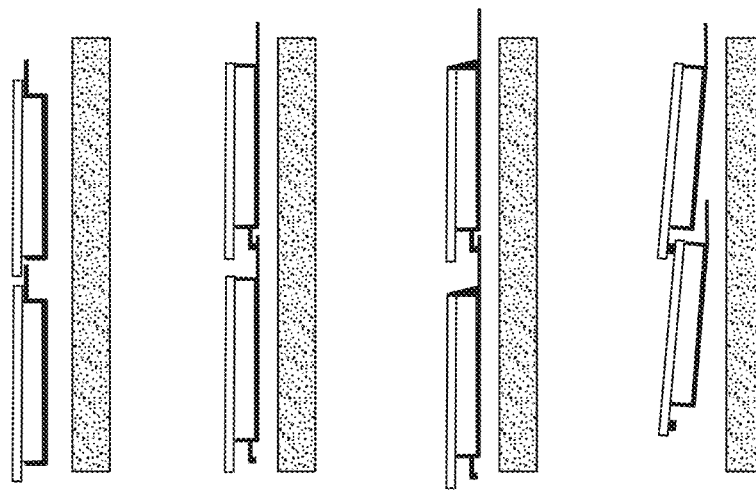
Figure 28C:
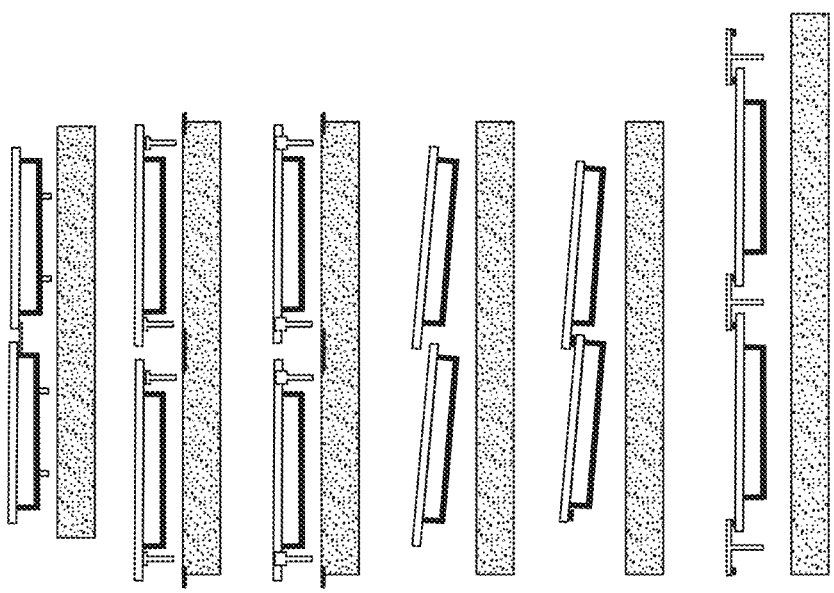
Figure 29:
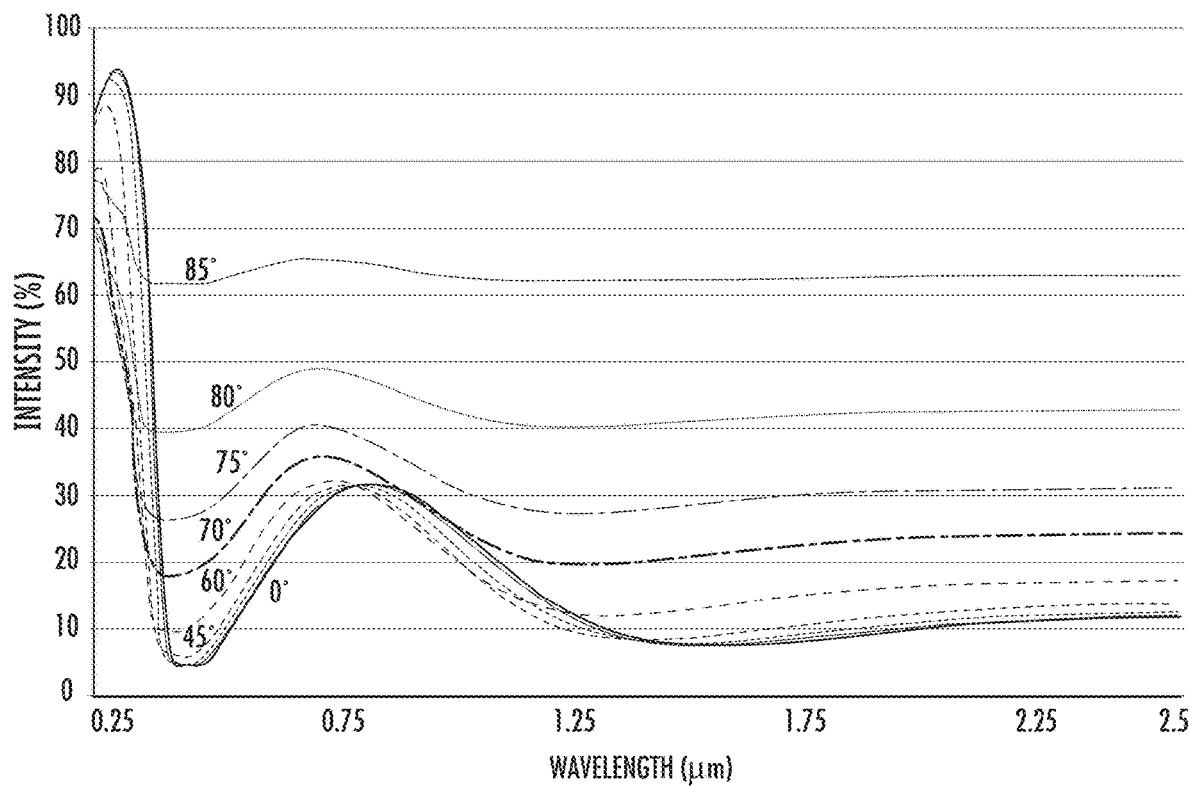
FIG. 29 illustrates the angular stability of 1931 CIE (x, y) colour coordinates under CIE-D65 illuminant of the embodiment of Example 10.
Figure 30:
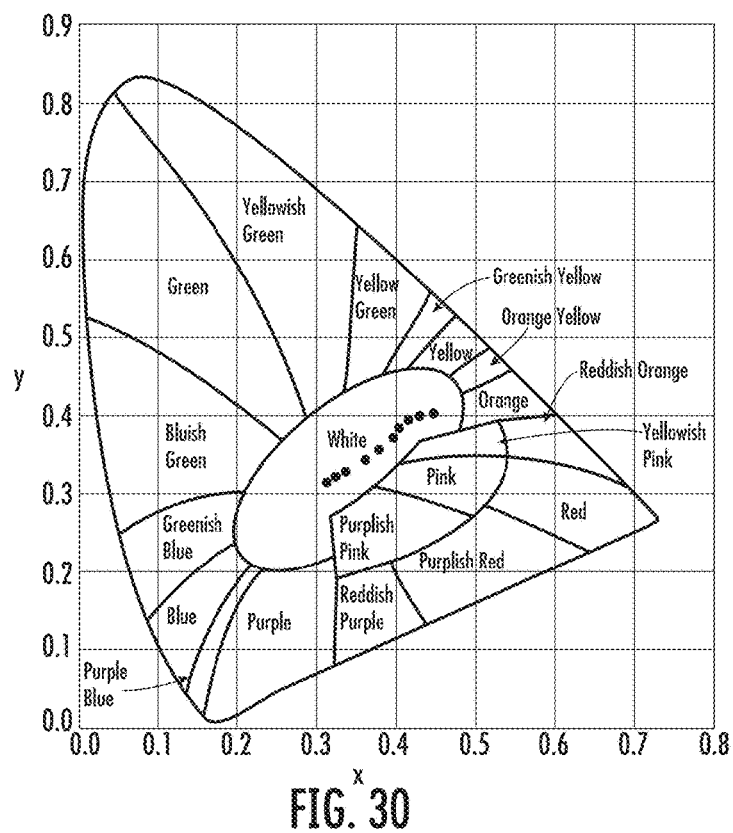
FIG. 30 demonstrates reflectance curves for the embodiment of Example 10 for various angles of reflection (from 0° to 85°).
Figure 31:
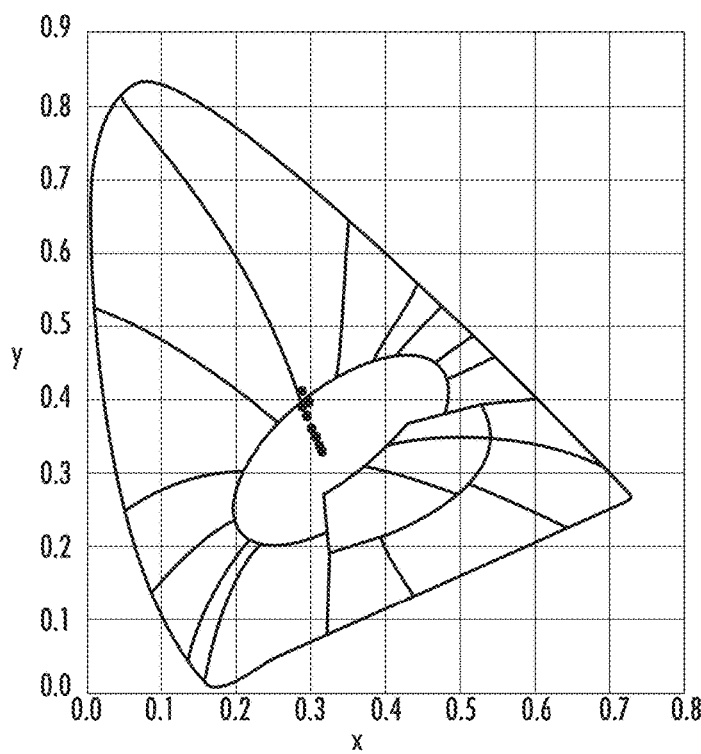
FIG. 31 illustrates the angular stability of 1931 CIE (x, y) colour coordinates under CIE-D65 illuminant of the embodiment of Example 11.
Figure 32:
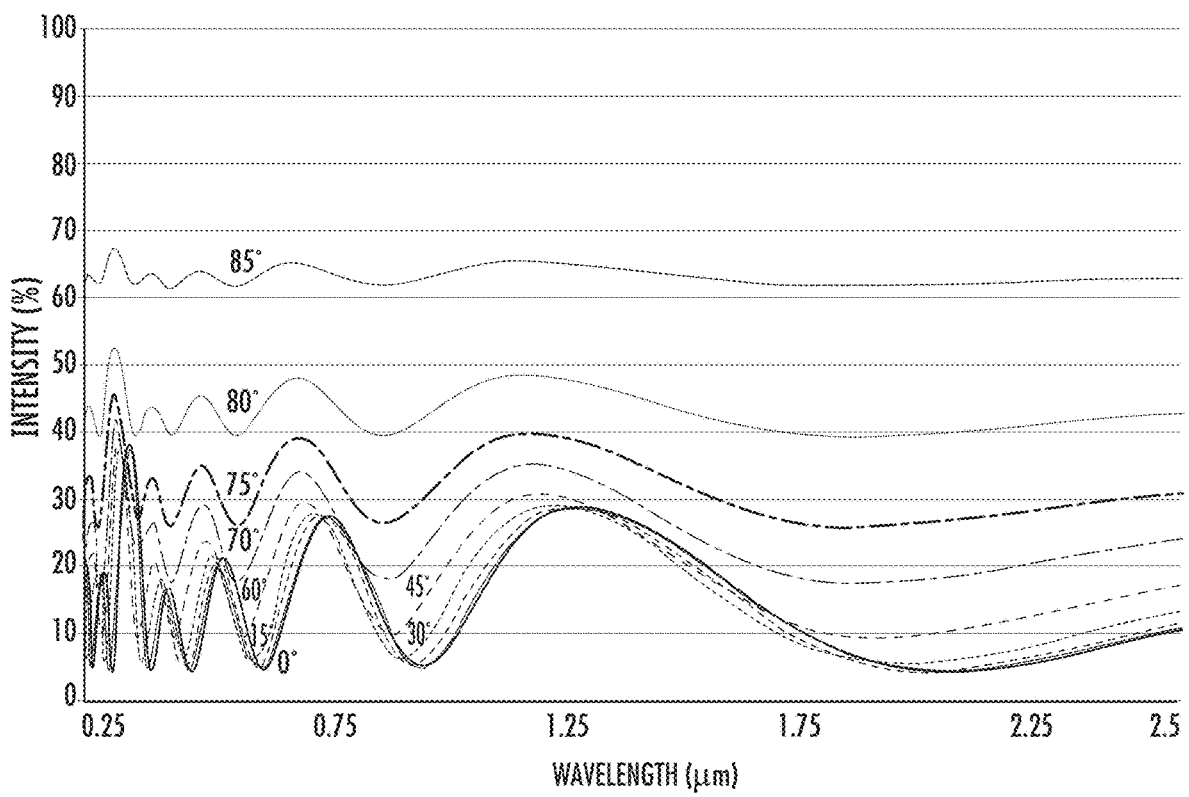
FIG. 32 demonstrates reflectance curves for the embodiment of Example 10 for various angles of reflection (from 0° to 85°).
Figure 33:
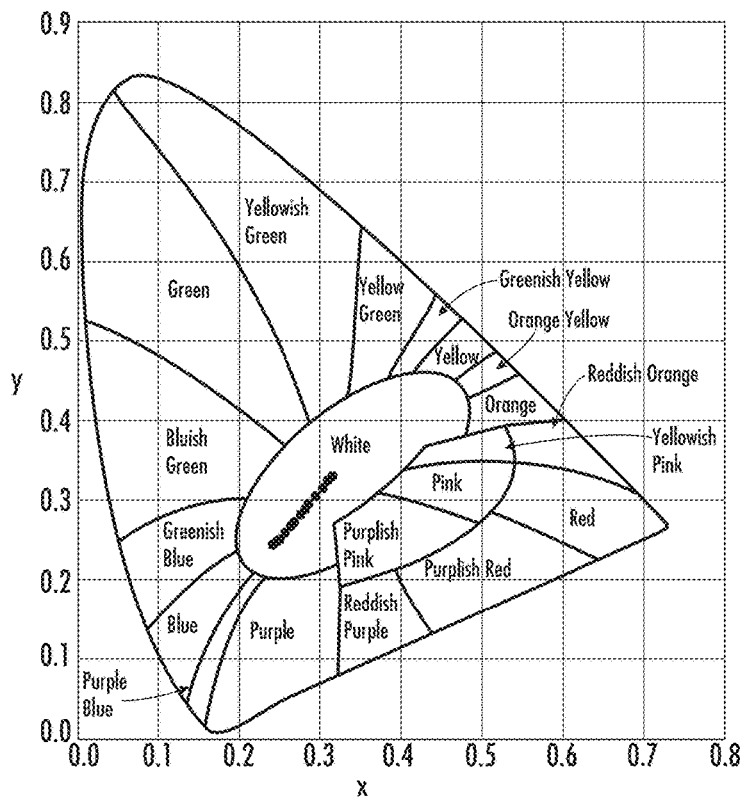
FIG. 33 illustrates the angular stability of 1931 CIE (x, y) colour coordinates under CIE-D65 illuminant of the embodiment of Example 11.

These capabilities facilitate the production of polyvalent articles of manufacture, which ensures considerable flexibility for roof and façade installation. As an example, FIG. 28A, 28B, 28C present possible variations for the mounting of thermal solar systems glued behind a coloured laminated glazing. In FIG. 28A, the solar thermal collectors are glued on the back of laminated glazing that is larger than the frame of the collectors. Here the solar collectors are mounted on a roof with glazing overlap, and the waterproofing is provided by the presence of seals between two overlapping glazings. Different variations for the mounting of solar thermal collectors in ventilated façade either for residential façade or for large buildings with glass facades are shown respectively in FIGS. 28AB, 28C. Here, the hangers, the overlap wings, the seals and so on can be adaptable to the wishes of the architect, the type and requirements of the building, the local cultural and other considerations). Same mounting configurations are of course possible for photovoltaic devices, but also for hybrid (combination of thermal and PV devices) roof and facades installations.

(D) Optional Anti-Reflection Coating(s)

Figure 3B:
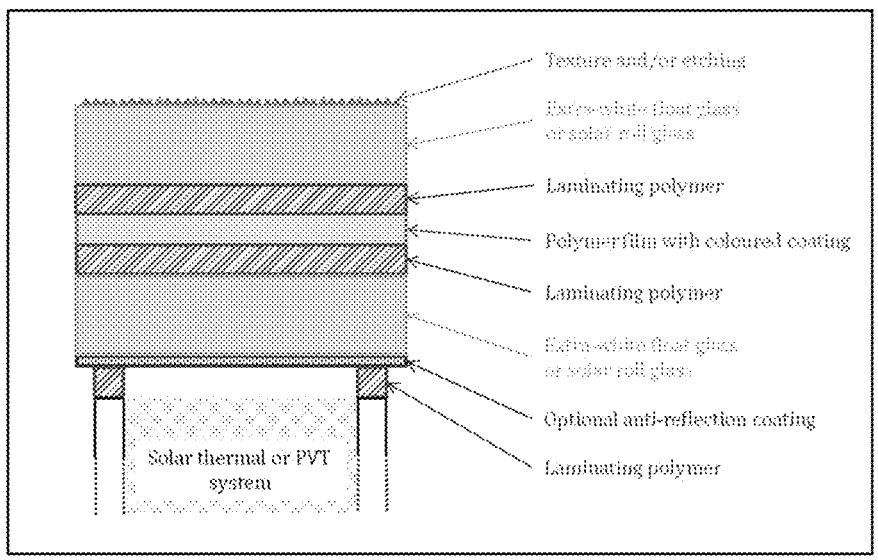
Figure 3C:
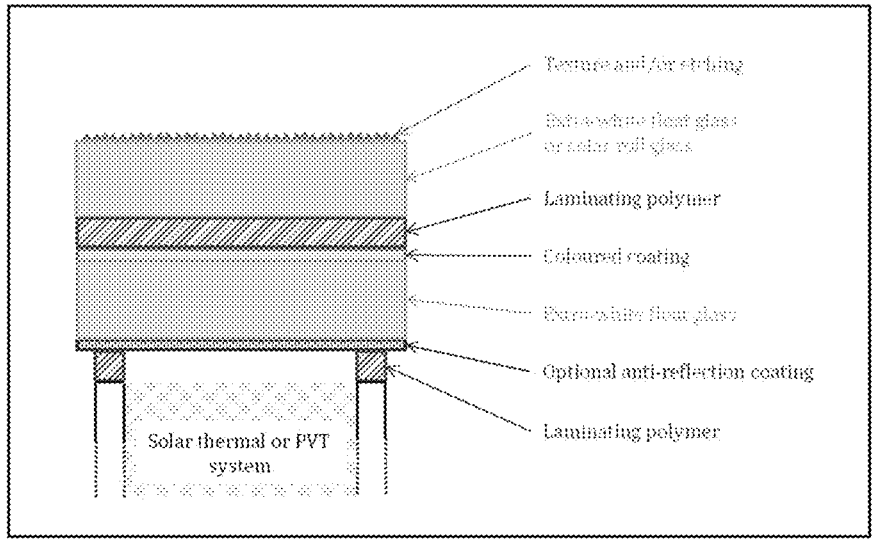
Figure 4A:
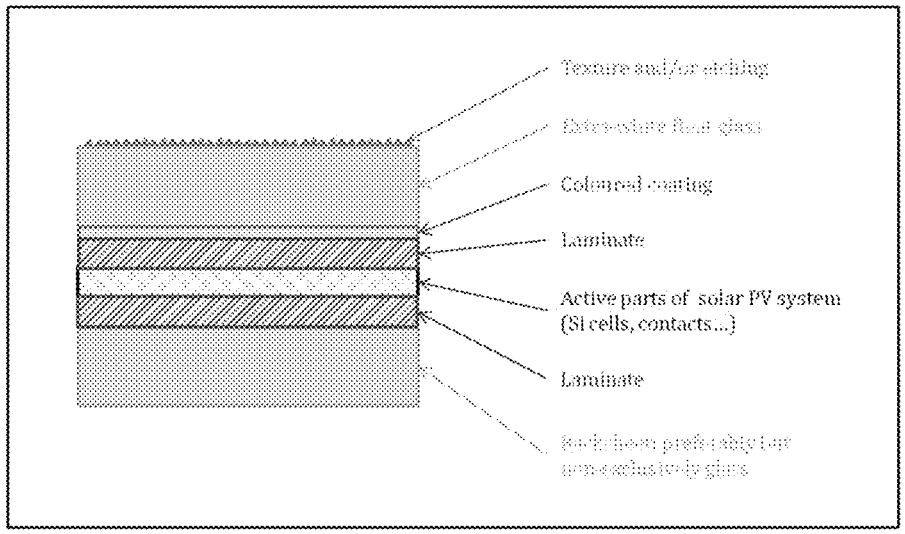
FIGS. 4A, 4B, 4C are schematic drawings illustrating non-limiting examples possible configurations of coloured laminated glazing units and/or articles of manufacture incorporating such units for PV applications. The coloured coating can be deposited on the back side of the outer substrate or pane (glass, as shown), FIG. 4A; on one side of a polymeric film that is encapsulated between two substrates (as shown—glass panes), FIG. 4B; and on the front side of the inner substrate (as shown pane of glass), FIG. 4C. Here, the active component of a given PV device (as represented by an Si cell, for example) is shown to be fully integrated into given laminated glazing unit.
Figure 4B:
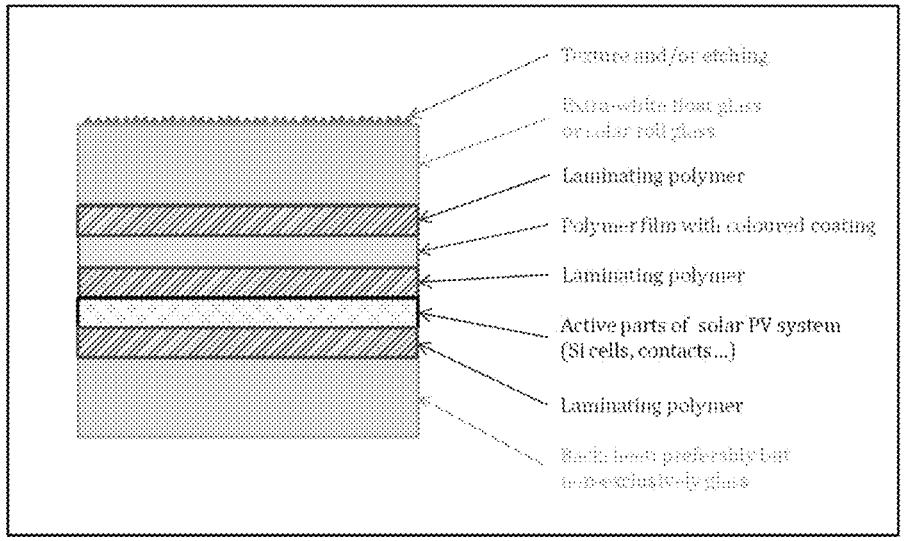
Figure 4C:
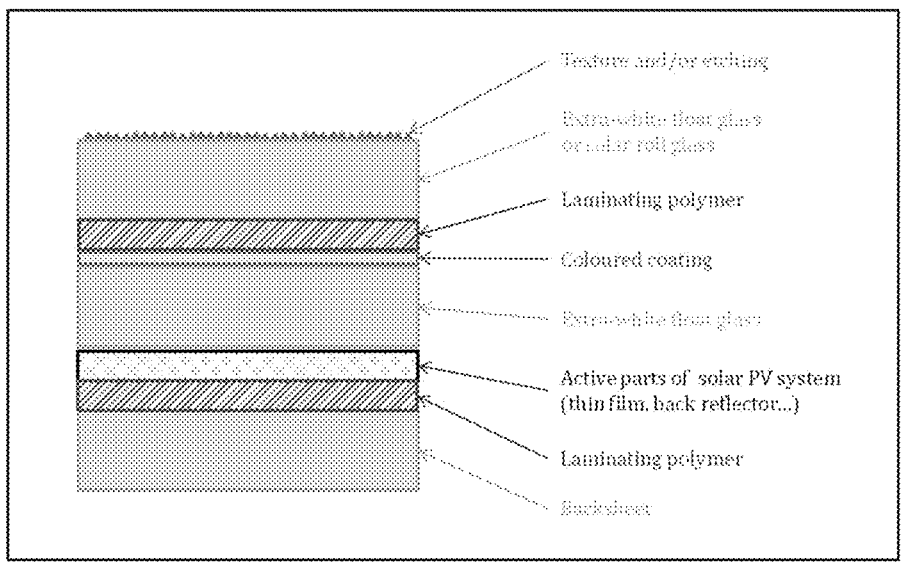

In order to increase the solar transmittance of solar thermal devices, an anti-reflection coating can be applied to the back-side of the inner substrate pane (see FIGS. 3A, 3B, 3C for non-limiting examples). In fact, a maximum transmittance value of approximately 92% can be achieved for the best quality glass as a reflectance of 4% on both sides of the glass occurs. By applying an anti-reflection coating characterised by a low refractive index (preferably, lower than 1.52), the reflectance of the glass side can be reduced by approximately 3%. Ideally, the solar transmittance of the coloured laminated glazing can then be increased by about 3% to thereby compensate the transmittance losses caused by the presence of the interferential coloured coating itself. Specific Non-Limiting Examples of Thin-Film Stack Designs.

The following represent designs of various thin-film stacks representing conventional solutions utilized in related art (Example 1) and embodiments of the present invention as discussed (Examples 2 through Example 13). The notation in the description of these Examples substantially follows the convention: incident medium//(short-cut description of thin-film layers and intermediate substrate, if any)//output medium. Here, "H" conventionally stands for a layer of material with high refractive index nil, "L" conventionally stands for a layer of material with low refractive index $n_L$. Thicknesses of material layers H and L are indicated with some tolerance, which is specified in reference to the central, stated value of the thickness. For example, the notation of "185±12 nm of H" means that the layer of high-index material has a designated thickness of 185 nm and a tolerance of +/−12 nm with respect to this designated thickness, while the notation of "70 nm+/−5% of L" implies that the thickness of the low-index layer of material can deviate from the target value of 70 nm by +/−5% of 70 nm (that is, in this case, by +/−3.5 nm). Each of the incident medium, intermediate substrate, and output medium do not qualify as "thin films" as understood by a skilled artisan, in that optical interference effects in these media, caused by incident light propagating therethrough, can be and are neglected. The chosen central wavelength for the thin-film designs is 550 nm.

Example 1 air//136 nm of L/222 nm of H//glass//222 nm of H/136 nm of L//air; with $n_H$=1.54 and $n_L$=1.8

Example 2 air//glass//30 nm of H/25 nm of L/320 nm of H//polymer; with $n_H$=2.4 and $n_L$=1.65

Example 3 air//glass//185±12 nm of H/25±12 nm of L/35±12 nm of H/35±12 nm of L/130±12 nm of H//polymer; with $n_H$=2.4 and $n_L$=2.0

Example 4 air//glass//160±12 nm of H/130±12 nm of L/65±12 nm of H/25±12 nm of L/70±12 nm of H/160±12 nm of L/100±12 nm of H//polymer; with $n_H$=2.2 and $n_L$=2.0

Example 5 air//glass//45±12 nm of H/70±12 nm of L/45±12 nm of H//polymer; with $n_H$=2.0 and $n_L$=1.65

Example 6 air//glass//175±12 nm of H/85±12 nm of L/50±12 nm of H/25±12 nm of L/300±12 nm of H//polymer; with $n_H$=2.4 and $n_L$=2.0

Example 7 air//glass//120±12 nm of H/120±12 nm of L/95±12 nm of H/90±12 nm of L/90±12 nm of H/95±12 nm of L/100±12 nm of H//polymer; with $n_H$=2.0 and $n_L$=1.65

Example 8 air//glass//40±12 nm of H/75±12 nm of L//polymer; with $n_H$=2.4 and $n_L$=1.65

Example 9 air//glass//50±12 nm of H/90±12 nm of L/65±12 nm of H/55±12 nm of L//polymer; with $n_H$=2.4 and $n_L$=2.0

Example 10 air//glass//100 nm+/−5% of H//57 nm+/−5% of L//29 nm+/−10% of H//37 nm+/−10% of L//39 nm+/−10% of H//45 nm+/−10% of L//15 nm+/−15% of H//polymer; with $n_H$=2.5 and $n_L$=1.25

Example 11 air//glass//97 nm+/−5% of H//120 nm+/−2.5% of L//48 nm+/−10% of H//17 nm+/−15% of L//113 nm+/−2.5% of H//polymer; with $n_H$=2.5 and $n_L$=2.2

Example 12 air//glass//70 nm+/−5% of H//70 nm+/−5% of L//50 nm+/−10% of H//50 nm+/−10% of L//20 nm+/−15% of H//polymer; with $n_H$=1.8 and $n_L$=1.25

Example 13 air//glass//20 nm+/−15% of H//44 nm+/−10% of L//36 nm+/−10% of H//155 nm+/−2.5% of L//20 nm+/−15% of H//175 nm+/−2.5% of L//74 nm+/−5% of H//183 nm+/−2.5% of L//109 nm+/−2.5% of H//polymer; with $n_H$=2.2 and $n_L$=1.8

According to various considerations, discussed in this disclosure in sufficient detail, a skilled artisan is now enabled to produce a laminated glazing unit which, when used in conjunction with a solar energy system, makes the perception of such solar energy system by an outside observer to be visually appealing without substantial change of such appearance as a function of the angle of observation of the unit and without sacrifice of the efficiency of the solar energy conversion.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art such as to reasonably denote language of approximation. The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated may vary within a range defined by an experimental measurement error that is typical when using a measurement method accepted in the art for such purposes. As a non-limiting example, the terms "approximately" and about", when used in reference to a numerical value, represent a range of plus or minus 20% with respect to the specified value, more preferably plus or minus 10%, even more preferably plus or minus 5%, most preferably plus or minus 2%.

References made throughout this specification to "one embodiment," "an embodiment," "a related embodiment," or similar language mean that a particular feature, structure, or characteristic described in connection with the referred to "embodiment" is included in at least one embodiment of the present invention. Thus, appearances of these phrases and terms may, but do not necessarily, refer to the same implementation. It is to be understood that no portion of disclosure, taken on its own and in possible connection with a figure, is intended to provide a complete description of all features of the invention.

It is also to be understood that no single drawing is intended to support a complete description of all features of the invention. In other words, a given drawing is generally descriptive of only some, and generally not all, features of the invention. A given drawing and an associated portion of the disclosure containing a description referencing such drawing do not, generally, contain all elements of a particular view or all features that can be presented is this view, for purposes of simplifying the given drawing and discussion, and to direct the discussion to particular elements that are featured in this drawing. A skilled artisan will recognize that the invention may possibly be practiced without one or more of the specific features, elements, components, structures, details, or characteristics, or with the use of other methods, components, materials, and so forth. Therefore, although a particular detail of an embodiment of the invention may not be necessarily shown in each and every drawing describing such embodiment, the presence of this detail in the drawing may be implied unless the context of the description requires otherwise. In other instances, well known structures, details, materials, or operations may be not shown in a given drawing or described in detail to avoid obscuring aspects of an embodiment of the invention that are being discussed.

The invention as recited in claims appended to this disclosure is intended to be assessed in light of the disclosure as a whole, including features disclosed in prior art to which reference is made.

While the invention is described through the above-described exemplary embodiments, it will be understood by those of ordinary skill in the art that modifications to, and variations of, the illustrated embodiments may be made without departing from the inventive concepts disclosed herein. Disclosed aspects, or portions of these aspects, may be combined in ways not listed above. Accordingly, the invention should not be viewed as being limited to the disclosed embodiment(s).

The invention claimed is:

1. A laminated glazing unit for architectural integration of solar energy systems, comprising:
    a layered glazing structure that includes
        a substrate having a substrate refractive index $n_{sub}$ a value of which at a wavelength of 550 nm is between 1.45 and 1.6;
        a multi-layered interference filter disposed on a first surface of the substrate and containing a non-quarter-wave thin-film stack defined at said wavelength of 550 nm,
            wherein thicknesses of any two high-index material layers sandwiching an immediately-adjacent low-index material layer therebetween are different from one another and wherein thicknesses of any two low-index material layers sandwiching an immediately-adjacent high-index material layer therebetween are different from one another,
            wherein the high-index layers each have a refractive index from 1.8 to 2.5 and the low refractive index layers each have a refractive index from 1.25 to 2.2;
    and
        a laminating polymer layer disposed on the multi-layered interference filter, said laminating polymer layer having a polymer refractive index $n_{pol}$ a value of which at the wavelength of 550 nm between 1.45 and 1.6;
        wherein said layered glazing structure, when the substrate is in contact with an incident medium having a refractive index of $n_{inc}=1$, is characterized by a first reflectance value for IR light at every wavelength between 1 micron and 2.5 micron is between 65% and 29% for at least angles of reflection of zero degrees, 65 degrees, 70 degrees, 75 degrees, 80 degrees, and 85 degrees.

2. The glazing unit according to claim 1, wherein a second surface of the substrate contains a surface micro-structure or a surface nano-structure configured as a light diffuser for light at wavelengths in the visible portion the optical spectrum.

3. The glazing unit according to claim 1, wherein at least one of the following conditions is satisfied:
    (a) a variation of a dominant wavelength $\lambda_{MD}$ of a dominant color, characterizing said light in the visible portion of the optical spectrum that is reflected by the layered glazing structure at an angle $\theta_r$, of less than 5 nm for every $\theta_r<60°$; and
    (b) the glazing unit further comprises a solar thermal collector or a solar photovoltaic (PV) panel disposed to be separated from the multi-layered interference filter by the laminating polymer layer.

4. The glazing unit according to claim 3, wherein said solar thermal collector and said laminating polymer layer are in direct contact with one another.

5. The glazing unit according to claim 3, wherein an active element of the solar PV panel is fully integrated in the layered glazing structure.

6. The glazing unit according to claim 1, wherein the substrate comprises solar roll glass, an extra-white float glass with iron content of less than 120 ppm, or a polymeric material characterized by a total hemispherical solar transmittance higher than 90%.

7. The glazing unit according to claim 1,
    wherein the laminating polymer layer comprises an elastomer cross-linking polymer, a thermoplastic product, or an ionoplastic polymer, and
    wherein the total hemispherical solar transmittance of the glazing unit is higher than 92% when a thickness of the laminating polymer layer is between 0.4 mm and 0.5 mm.

8. The glazing unit according to claim 1,
    wherein said multi-layered interference filter includes a thin-film stack of up to 9 layers that have corresponding physical thicknesses of up to 400 nm, wherein materials of said layers have corresponding extinction coefficients k not exceeding 0.2 at every wavelength between 450 nm and 2,500 nm.

9. The glazing unit according to claim 1,
    wherein the substrate includes glass or polymer,
    wherein said multi-layered interference filter is a spatially-asymmetric filter that includes 7 thin-film layers such that the layered glazing structure is configured to satisfy a design of:
    incident medium of air|the substrate |H1|L1|H2|L2|H3|L3|H4| exit medium of said polymer layer,
        wherein H1 denotes a layer of a high-refractive-index material with a refractive index of $1.8 \leq n_{H1} \leq 2.5$ at the wavelength of 550 nm and a first physical thickness of 100 nm±5%,
        wherein L1 denotes a layer of a low-refractive-index material with a refractive index of $1.25 \leq n_{L1} \leq 2.2$ at the wavelength of 550 nm and a second physical thickness of 57 nm±5%,
        wherein H2 denotes a layer of the high-refractive-index material with the refractive index of $1.8 \leq n_{H2} \leq 2.5$ at the wavelength of 550 nm and a third physical thickness of 29 nm±10%, and
        wherein L2 denotes a layer of the low-refractive-index material with a refractive index of $1.25 \leq n_{L2} \leq 2.2$ at the wavelength of 550 nm and a fourth physical thickness of 37 nm±10%,
        wherein H3 denotes a layer of the high-refractive-index material with the refractive index of $1.8 \leq n_{H3} \leq 2.5$ at the wavelength of 550 nm and a fifth physical thickness of 39 nm±10%, wherein L3 denotes a layer of the low-refractive-index material with a refractive index of $1.25 \le n_{L3} \le 2.2$ at the wavelength of 550 nm and a sixth physical thickness of 45 nm±10%, wherein H4 denotes a layer of the high-refractive-index material with the refractive index of $1.8 n_{H4} \le 2.5$ at the wavelength of 550 nm and a seventh physical thickness of 15 nm±15%, and wherein light incident onto the substrate and reflected by said article is perceived as yellow or greenish-yellow.

10. The glazing unit according to claim 1, wherein the substrate includes glass or polymer, wherein said multi-layered interference filter is a spatially-asymmetric filter that includes 5 thin-film layers such that the layered glazing structure is configured to satisfy a design of:

incident medium of air the substrate |H1|L1|H2|L2|H3| exit medium of said polymer layer, wherein H1 denotes a layer of a high-refractive-index material with a refractive index of $1.8 \le n_{H1} \le 2.5$ at the wavelength of 550 nm and a first physical thickness of 97 nm±5%, wherein L1 denotes a layer of a low-refractive-index material with a refractive index of $1.25 \le n_{L1} \le 2.2$ at the wavelength of 550 nm and a second physical thickness of 120 nm±2.5%, wherein H2 denotes a layer of the high-refractive-index material with the refractive index of $1.8 \le n_{H2} \le 2.5$ at the wavelength of 550 nm and a third physical thickness of 48 nm±10%, and wherein L2 denotes a layer of the low-refractive-index material with a refractive index of $1.25 \le n_{L2} \le 2.2$: at the wavelength of 550 nm and a fourth physical thickness of 17 nm±15%, wherein H3 denotes a layer of the high-refractive-index material with the refractive index of $1.8 \le n_{H3} \le 2.5$ at the wavelength of 550 nm and a fifth physical thickness of 113 nm±2.5%, and wherein light incident onto the substrate and reflected by said article is perceived as yellowish-green.

11. The glazing unit according to claim 1, wherein the substrate includes glass or polymer, wherein said multi-layered interference filter is a spatially-asymmetric filter that includes 5 thin-film layers such that the layered glazing structure is configured to satisfy a design of:

incident medium of air|the substrate |H1|L1|H2|L2|H3| exit medium of said polymer layer, wherein H1 denotes a layer of a high-refractive-index material with a refractive index of $1.8 \le n_{H1} \le 2.5$ at the wavelength of 550 nm and a first physical thickness of 70 nm±5%, wherein L1 denotes a layer of a low-refractive-index material with a refractive index of $1.25 \le n_{L1} \le 2.2$ at the wavelength of 550 nm and a second physical thickness of 70 nm±5%, wherein H2 denotes a layer of the high-refractive-index material with the refractive index of $1.8 \le n_{H2} \le 2.5$ at the wavelength of 550 nm and a third physical thickness of 50 nm+10%, and wherein L2 denotes a layer of the low-refractive-index material with a refractive index of $1.25 \le n_{L2} \le 2.2$ at the wavelength of 550 nm and a fourth physical thickness of 50 nm±10%, wherein H3 denotes a layer of the high-refractive-index material with the refractive index of $1.8 \le n_{H3} \le 2.5$ at the wavelength of 550 nm and a fifth physical thickness of 20 nm±15%, and wherein light incident onto the substrate and reflected by said article is perceived as yellowish-green.

12. The glazing unit according to claim 1, wherein the substrate includes glass or polymer, wherein said multi-layered interference filter is a spatially-asymmetric filter that includes 9 thin-film layers such that the layered glazing structure is configured to satisfy a design of:

incident medium of air the substrate |H1|L1|H2|L2|H3|L3|H4|L4|H5| exit medium of said polymer layer, wherein said multi-layered interference filter is a spatially-asymmetric filter that includes 9 thin-film layers such that the layered glazing structure is configured to satisfy a design of:

incident medium of air the substrate |H1|L1|H2|L2|H3|L3|H4|L4|H5| exit medium of said polymer layer, wherein H1 denotes a layer of a high-refractive-index material with a refractive index of $1.8 \le n_{H1} \le 2.5$ at the wavelength of 550 nm and a first physical thickness of 20 nm±15%, wherein L1 denotes a layer of a low-refractive-index material with a refractive index of $125 \le n_{L1} \le 2.2$ at the wavelength of 550 nm and a second physical thickness of 44 nm±10%, wherein H2 denotes a layer of the high-refractive-index material with the refractive index of $1.8 \le n_{H2} \le 2.5$ at the wavelength of 550 nm and a third physical thickness of 36 nm±10%, wherein L2 denotes a layer of the low-refractive-index material with a refractive index of $1.25 \le n_{L2} \le 2.2$ at the wavelength of 550 nm and a fourth physical thickness of 155 nm±2.5%, wherein H3 denotes a layer of the high-refractive-index material with the refractive index of $1.8 n_{H3} \le 2.5$ at the wavelength of 550 nm and a fifth physical thickness of 20 nm±15%, wherein L3 denotes a layer of the low-refractive-index material with a refractive index of $1.25 \le n_{L2} \le 2.2$ at the wavelength of 550 nm and a fourth physical thickness of 175 nm±2.5%, wherein H4 denotes a layer of the high-refractive-index material with the refractive index of $1.8 \le n_{H3} \le 2.5$ at the wavelength of 550 nm and a fifth physical thickness of 74 nm±5%, wherein L4 denotes a layer of the low-refractive-index material with a refractive index of $1.25 \le n_{L2} \le 2.2$ at the wavelength of 550 nm and a fourth physical thickness of 183 nm±2.5%, wherein H5 denotes a layer of the high-refractive-index material with the refractive index of $1.8 \le n_{H5} \le 2.5$ at the wavelength of 550 nm and a fifth physical thickness of 109 nm±2.5%, and wherein light incident onto the substrate and reflected by said unit is perceived as greenish-blue.

13. The glazing unit according to claim 1, wherein at least one of the following conditions is satisfied:

(a) wherein a value of saturation of color, of light incident onto the substrate and reflected by said glazing unit and defined by $C_{ab}^* = \sqrt{(a^*)^2+(b^*)^2}$ according to CIE color coordinates L*, a* and b* under daylight illumination CIE-D65, is higher than 8 at normal angle of reflection; and (b) a total hemispherical solar transmittance is above 80% at normal incidence.

14. A laminated glazing unit for architectural integration of solar energy systems, comprising:
a layered glazing structure that includes
a substrate having a substrate refractive index $n_{sub}$ a value of which at a wavelength of 550 nm is between 1.45 and 1.6;
a multi-layered interference filter disposed on a first surface of the substrate and containing a non-quarter-wave thin-film stack defined at said wavelength of 550 nm,
wherein thicknesses of any two high-index material layers sandwiching an immediately-adjacent low-index material layer therebetween are different from one another and wherein thicknesses of any two low-index material layers sandwiching an immediately-adjacent high-index material layer therebetween are different from one another,
wherein the high-index layers each have a refractive index from 1.8 to 2.5 and the low refractive index layers each have a refractive index from 1.25 to 2.2;
and
a laminating polymer layer disposed on the multi-layered interference filter, said laminating polymer layer having a polymer refractive index $n_{pol}$ a value of which at the wavelength of 550 nm between 1.45 and 1.6;
wherein said layered glazing structure, when the substrate is in contact with an incident medium having a refractive index of $n_{inc}=1$, is characterized by a first reflectance value for IR light at every wavelength between 1 micron and 2.5 micron is between 65% and 14% for at least angles of reflection of zero degrees, 65 degrees, 70 degrees, 75 degrees, 80 degrees, and 85 degrees.

15. The glazing unit according to claim 14, wherein a variation of a dominant wavelength $\lambda_{MD}$ of a dominant color, characterizing said light in the visible portion of the optical spectrum that is reflected by the layered glazing structure at an angle $\theta_r$, is less than at least one of
a) 3 nm for every $\theta_r < 60°$; and
b) 1 nm for every $\theta_r < 75°$.

16. The glazing unit according to claim 14, characterized by a total hemispherical solar transmittance value that is above 80% at normal incidence.

17. The glazing unit according to claim 14, further comprising a solar thermal collector or a solar photovoltaic (PV) panel disposed to be separated from the multi-layered interference filter by the laminating polymer layer.

18. A laminated glazing unit for architectural integration of solar energy systems, comprising:
a layered glazing structure that includes a substrate having a substrate refractive index $n_{sub}$ a value of which at a wavelength of 550 nm is between 1.45 and 1.6;
a multi-layered interference filter disposed on a first surface of the substrate and containing a non-quarter-wave thin-film stack defined at said wavelength of 550 nm,
wherein thicknesses of any two high-index material layers sandwiching an immediately-adjacent low-index material layer therebetween are different from one another and wherein thicknesses of any two low-index material layers sandwiching an immediately-adjacent high-index material layer therebetween are different from one another,
wherein the high-index layers each have a refractive index from 1.8 to 2.5 and the low refractive index layers each have a refractive index from 1.25 to 2.2;
and
a laminating polymer layer disposed on the multi-layered interference filter, said laminating polymer layer having a polymer refractive index $n_{pol}$ a value of which at the wavelength of 550 nm between 1.45 and 1.6;
wherein said layered glazing structure, when the substrate is in contact with an incident medium having a refractive index of $n_{inc}=1$, is characterized by a first reflectance value for IR light at every wavelength between 1 micron and 2.5 micron is between 18% and 5% for at least angles of reflection of zero degrees, 15 degrees, 30 degrees, 45 degrees, 60 degrees, 70 degrees, and 75 degrees.

19. The glazing unit according to claim 18, characterized by a total hemispherical solar transmittance value that is above 90% at normal incidence.

20. The glazing unit according to claim 18, further comprising a solar thermal collector or a solar photovoltaic (PV) panel disposed to be separated from the multi-layered interference filter by the laminating polymer layer.

* * * * *